United States Patent
Ho et al.

(10) Patent No.: US 11,919,049 B2
(45) Date of Patent: Mar. 5, 2024

(54) SUBSTRATE PROCESSING METHOD AND SUBSTRATE PROCESSING APPARATUS

(71) Applicant: SCREEN Holdings Co., Ltd., Kyoto (JP)

(72) Inventors: Linh da Ho, Kyoto (JP); Masaki Inaba, Kyoto (JP); Kei Suzuki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 21 days.

(21) Appl. No.: 17/732,154

(22) Filed: Apr. 28, 2022

(65) Prior Publication Data

US 2022/0395869 A1    Dec. 15, 2022

(30) Foreign Application Priority Data

Jun. 9, 2021  (JP) ................ 2021-096444

(51) Int. Cl.
| | |
|---|---|
| *B08B 3/08* | (2006.01) |
| *B08B 3/02* | (2006.01) |
| *B08B 3/10* | (2006.01) |
| *H01L 21/02* | (2006.01) |
| *H01L 21/67* | (2006.01) |

(52) U.S. Cl.
CPC ............... *B08B 3/08* (2013.01); *B08B 3/02* (2013.01); *B08B 3/10* (2013.01); *H01L 21/02057* (2013.01); *H01L 21/67051* (2013.01); *B08B 2203/007* (2013.01)

(58) Field of Classification Search
CPC .... B08B 3/08; B08B 3/02; B08B 3/10; B08B 2203/007; H01L 21/02057; H01L 21/67051; H01L 21/31133; H01L 21/6719; H01L 21/68742; H01L 21/68792; H01L 21/6708; H01L 21/0206; H01L 21/6704;
(Continued)

(56) References Cited

U.S. PATENT DOCUMENTS

| | | | |
|---|---|---|---|
| 5,971,368 A | 10/1999 | Nelson et al. | |
| 6,478,035 B1 * | 11/2002 | Niuya | ............... H01L 21/31133 257/E21.255 |

(Continued)

FOREIGN PATENT DOCUMENTS

| | | | | |
|---|---|---|---|---|
| JP | 2006086409 A | * | 3/2006 | ........... H01L 21/304 |
| JP | 2010-087419 A | | 4/2010 | |

(Continued)

OTHER PUBLICATIONS

Machine translation of JP 2006-86409 (Year: 2006).*
(Continued)

*Primary Examiner* — Erin F Bergner
(74) *Attorney, Agent, or Firm* — OSTROLENK FABER LLP

(57) ABSTRACT

A substrate processing method for removing an organic film on a substrate includes a) carrying out introduction of ozone-containing gas into a substrate processing chamber to fill at least a space above the substrate in the substrate processing chamber with ozone-containing gas, b) starting spraying through the space a heated chemical liquid containing sulfuric acid onto the substrate after the a), c) continuing the spraying started in the b), and d) stopping the spraying continued in the c).

9 Claims, 12 Drawing Sheets

(58) Field of Classification Search
CPC ..... H01L 21/6715; G03F 7/423; G03F 7/427; G03F 7/422
See application file for complete search history.

(56) References Cited

U.S. PATENT DOCUMENTS

| | | | |
|---|---|---|---|
| 6,488,271 B1 | 12/2002 | Nelson et al. | |
| 6,869,487 B1 | 3/2005 | Bergman | |
| 2003/0145875 A1* | 8/2003 | Han | B08B 7/00 |
| | | | 257/E21.256 |
| 2006/0040506 A1* | 2/2006 | Gilton | H01L 21/31138 |
| | | | 257/E21.255 |
| 2007/0131254 A1* | 6/2007 | Kin | B08B 3/102 |
| | | | 134/94.1 |
| 2007/0227556 A1* | 10/2007 | Bergman | G03F 7/423 |
| | | | 134/28 |
| 2014/0045339 A1* | 2/2014 | Iwata | C11D 7/08 |
| | | | 156/345.11 |
| 2016/0042980 A1 | 2/2016 | Ohashi | |
| 2018/0033605 A1 | 2/2018 | Ota et al. | |
| 2018/0071772 A1 | 3/2018 | Akizuki | |
| 2021/0086238 A1 | 3/2021 | Horikoshi et al. | |

FOREIGN PATENT DOCUMENTS

| | | |
|---|---|---|
| JP | 2010-140965 A | 6/2010 |
| JP | 2013-150007 A | 8/2013 |
| JP | 2014-179491 A | 9/2014 |
| JP | 2016-181677 A | 10/2016 |
| TW | 202032654 A | 9/2020 |
| TW | 202111800 A | 3/2021 |
| TW | 202113964 A | 4/2021 |

OTHER PUBLICATIONS

Office Action and Search Report dated Nov. 23, 2022 in corresponding Taiwanese Patent Application No. 111117260 and English translation of Search Report.

* cited by examiner

SUBSTRATE PROCESSING METHOD AND SUBSTRATE PROCESSING APPARATUS

BACKGROUND OF THE INVENTION

Field of the Invention

The present invention relates to a substrate processing method and a substrate processing apparatus for removing an organic film on a substrate. Exemplary substrates include a semiconductor wafer, a substrate for a flat panel display (FPD) such as a liquid crystal display apparatus and an organic electroluminescence (EL) display apparatus, a substrate for an optical disk, a substrate for a magnetic disk, a substrate for a magneto-optical disk, a substrate for a photomask, a ceramic substrate, and a substrate for a solar cell.

Description of the Background Art

A method for manufacturing a semiconductor device usually includes a process of cleaning a substrate. Typically, a cleaning process of removing an unnecessary organic film (typically, a resist film) on a substrate is performed. For example, according to Japanese Patent Application Laid-Open No. 2016-181677, SPM cleaning using a sulfuric acid/hydrogen peroxide mixture (SPM) as a chemical liquid is performed on a surface of a substrate. However, this process consumes a large amount of SPM. Efficient reuse of SPM is difficult, which results in a high cost of chemical liquid and a high load of disposing waste liquid. Thus, in recent years, studies have been made on a substrate processing method that can reduce the material cost and the load of disposing waste liquid. One among those methods is SOM cleaning using a sulfuric acid and ozone mixture (SOM) as a chemical liquid instead of SPM. Sulfuric acid and ozone are mixed to generate peroxodisulfate ions ($S_2O_8^{2-}$) as active species (etchants).

For example, according to Japanese Patent Application Laid-Open No. 2013-150007, sulfuric acid containing microbubbles of ozone gas is supplied from a nozzle to a substrate. According to the specification of U.S. Pat. No. 6,869,487, by controlling the thickness of a liquid layer on a substrate, ozone that diffuses into and penetrates the liquid layer can reach a surface of the substrate.

The half-life of ozone is, for example, as relatively long as about 90 minutes in air at 150° C., but very short as less than 10 seconds in sulfuric acid at 150° C. As described above, ozone tends to quickly decompose in sulfuric acid. Thus, as in the technique described in Japanese Patent Application Laid-Open No. 2013-150007, when ozone is already contained in sulfuric acid before being discharged from a nozzle, it is likely that much of the ozone will decompose at an excessively early timing before reaching the vicinity of the substrate. Correspondingly, generation of active species by decomposition of ozone tends to occur at excessively early timings, and as a result, many of the active species are deactivated before reaching the substrate. Thus, it is difficult to perform substrate processing using the active species with high efficiency. Increasing ozone concentration by raising the pressure at which ozone is injected in chemical liquid may raise the processing efficiency, but it is practically difficult to stably maintain a high pressure state necessary for obtaining a significant effect.

In U.S. Pat. No. 6,869,487, ozone diffusion that causes ozone to penetrate a liquid layer on a substrate is required. According to the studies made by the present inventors, however, diffusion that causes ozone to penetrate a liquid layer is not likely to occur. It is therefore difficult also with this method to perform substrate processing with high efficiency.

SUMMARY

The present invention has been made to solve the above-mentioned problem. An object of the present invention is to provide a substrate processing method and a substrate processing apparatus capable of removing an organic film on a substrate with high efficiency while suppressing the cost of chemical liquid and the load of disposing waste liquid.

A first aspect of the present invention is a substrate processing method for removing an organic film on a substrate, the substrate processing method including a) carrying out introduction of ozone-containing gas into a substrate processing chamber to fill at least a space above the substrate in the substrate processing chamber with ozone-containing gas, b) starting spraying through the space a heated chemical liquid containing sulfuric acid onto the substrate after the a), c) continuing the spraying started in the b), and d) stopping the spraying continued in the c).

A second aspect of the present invention is the substrate processing method according to the first aspect in which the a) includes confirming that a measured value of at least either of pressure and ozone concentration in the substrate processing chamber is equal to or more than a predetermined threshold.

A third aspect of the present invention is the substrate processing method according to the first or second aspect in which, after the introduction of ozone-containing gas into the substrate processing chamber in the a), the introduction is continued in the b) and the c).

A fourth aspect of the present invention is the substrate processing method according to the first or second aspect in which after the introduction of ozone-containing gas into the substrate processing chamber in the a), the introduction is stopped before the c).

A fifth aspect of the present invention is the substrate processing method according to any one of the first to fourth aspects in which the chemical liquid sprayed in the c) is separated into a first liquid collected by being received by a cup section surrounding the substrate and a second liquid collected outside the cup section, and the second liquid not containing the first liquid is sprayed again.

A sixth aspect of the present invention is a substrate processing apparatus for removing an organic film on a substrate, the substrate processing apparatus including a substrate processing chamber, a substrate holder (a substrate holding unit) configured to hold the substrate in the substrate processing chamber, an ozone supplier (an ozone supply unit) configured to supply ozone-containing gas into the substrate processing chamber, an atomization nozzle configured to spray a chemical liquid onto the substrate, a chemical liquid supplier (a chemical liquid supply unit) including a heater and configured to supply the chemical liquid heated by the heater to the atomization nozzle, and controller (a control unit) configured to control the ozone supply unit to fill at least a space above the substrate in the substrate processing chamber with ozone-containing gas, and then control the chemical liquid supply unit to start spraying the chemical liquid through the space onto the substrate.

According to the first and sixth aspects of the present invention, first, ozone instead of hydrogen peroxide water is mixed with a heated chemical liquid containing sulfuric acid. This makes it easy to efficiently reuse the chemical liquid. Thus, the cost of chemical liquid and the load of disposing waste liquid can be suppressed. Second, the mixing is performed in a space above the substrate. This avoids, while using high-temperature sulfuric acid that easily causes ozone to decompose, occurrence of decomposition of ozone at an excessively early timing before reaching the vicinity of the substrate. Thus, a high proportion of active species generated by decomposition of ozone reach the substrate before being deactivated. Meanwhile, the mixing is performed by spraying the chemical liquid into ozone-containing gas. Spraying gives the chemical liquid a large surface area and thus promotes the reaction between the chemical liquid and ozone around the chemical liquid. Thus, without greatly depending on diffusion of ozone in the chemical liquid, the reaction between the chemical liquid and ozone proceeds quickly. As a result, a large amount of active species is produced immediately after the mixing. A high proportion of the large amount of active species reaches the substrate before being deactivated, as described above. Thus, the processing of removing an organic film on the substrate using the active species can be performed with high efficiency. Fourth, at a timing when the chemical liquid is sprayed, the space has already been filled with ozone-containing gas. This activates, from the timing of starting spraying of the chemical liquid, the reaction between the chemical liquid and ozone in the space. Thus, the necessary amount of the chemical liquid for the processing can be suppressed. As described above, an organic film on a substrate can be removed with high efficiency while suppressing the cost of chemical liquid and the load of disposing waste liquid.

According to the second aspect of the present invention, spraying is started after confirming that the measured value of at least either of the pressure and the ozone concentration in the substrate processing chamber is equal to or greater than a predetermined threshold. Thus, a sufficient amount of ozone can reliably be given in the space at the timing of starting spraying of the chemical liquid.

According to the third aspect of the present invention, introduction of ozone-containing gas is continued during spraying of the chemical liquid. This compensates for the decrease in the ozone concentration in the substrate processing chamber due to decomposition of ozone. Thus, the progress of the substrate processing can be kept approximately constant during the entire period in which the chemical liquid is sprayed.

According to the fourth aspect of the present invention, introduction of ozone-containing gas is stopped during spraying of the chemical liquid. Thus, the amount of consumed ozone-containing gas can be suppressed.

According to the fifth aspect of the present invention, a portion of the sprayed chemical liquid is sprayed again. Thus, the cost of chemical liquid and the load of disposing waste liquid can further be suppressed. The chemical liquid that is sprayed again does not contain the chemical liquid that has been received by a cup section, which avoids spraying of the chemical liquid that has been contaminated on the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
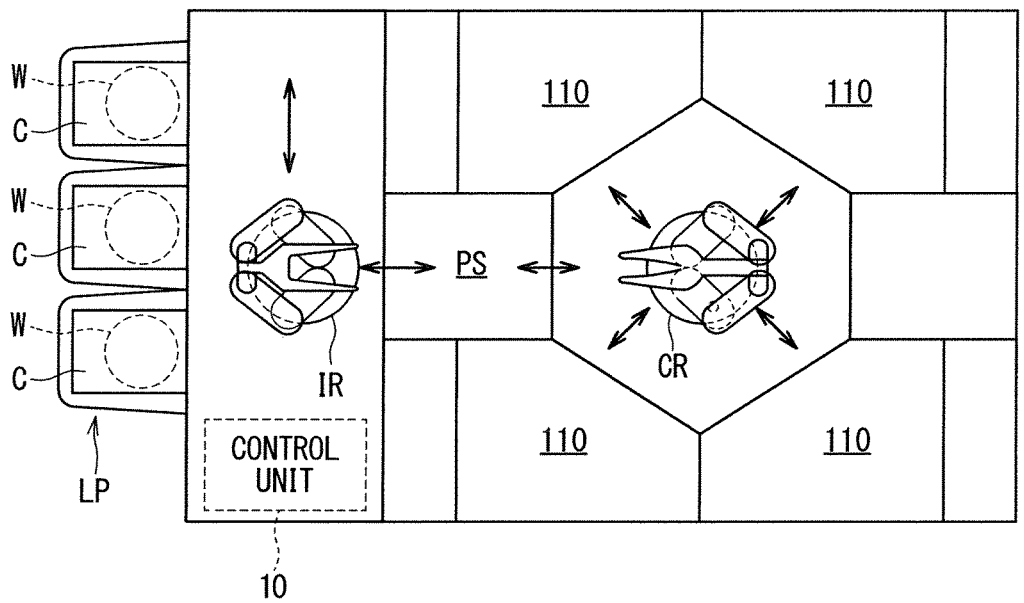
FIG. 1 is a plan view schematically illustrating a configuration of a substrate processing system according to preferred embodiments of the present invention.

Hereinafter, preferred embodiments will be described with reference to the accompanying drawings. In the following preferred embodiments, detailed features and the like are also given for the description of the art, but they are merely examples, and not all of them are necessarily essential features for implementation of the preferred embodiments. The drawings are schematically illustrated, and omission and/or simplification of a configuration is appropriately made in the drawings for convenience of description. Relationship among the sizes and positions of configurations and the like in different drawings is not necessarily accurately illustrated, and is appropriately changeable. In a drawing other than a cross-sectional view, such as a plan view, hatching may be given to facilitate understanding of the content of the preferred embodiment. In the following description, similar components are denoted by the same reference numeral, and they are given similar names and functions. Thus, detailed description on a similar component may be omitted to avoid duplicated description. In the following description, when a component is described with "comprising", "including", "having", or the like, such description does not have exclusive meaning of excluding the presence of other components unless otherwise specified.

<Substrate Processing System>

FIG. 1 is a plan view schematically illustrating an example configuration of a substrate processing system 1.

The substrate processing system 1 includes a load port LP, an indexer robot IR, a center robot CR, a control unit 10, and at least one processing unit 110 (four processing units in FIG. 1). The substrate processing system 1 is for removing an organic film (e.g., a resist film) on a substrate W.

Each processing unit 110 is for processing the substrate W (wafer). The processing unit 110 is a single wafer processing apparatus that can be used for substrate processing. The control unit 10 can control the operations of the components of the substrate processing system 1. The carrier C is a container that accommodates the substrate W. The load port LP is a container holding mechanism that holds a plurality of carriers C. The indexer robot IR can carry the substrate W between the load port LP and a substrate placing unit PS. The center robot CR can carry the substrate W between the substrate placing unit PS and the processing unit 110. With the above configuration, the indexer robot IR, the substrate placing unit PS, and the center robot CR function as a carrying mechanism that carries the substrate W between each processing unit 110 and the load ports LP.

The unprocessed substrate W is taken out from the carrier C by the indexer robot IR. Then, the unprocessed substrate W is transferred to the center robot CR via the substrate placing unit PS. The center robot CR carries the substrate W that is not yet processed into the processing unit 110. Then, the processing unit 110 performs processing on the substrate W. The substrate W processed in the processing unit 110 is taken out from the processing unit 110 by the center robot CR. The processed substrate W is sent to a different processing unit 110 if necessary, and is then passed to the indexer robot IR via the substrate placing unit PS. The indexer robot IR carries the processed substrate W into the carrier C. The processing of the substrate W is performed as described above.

Figure 2:
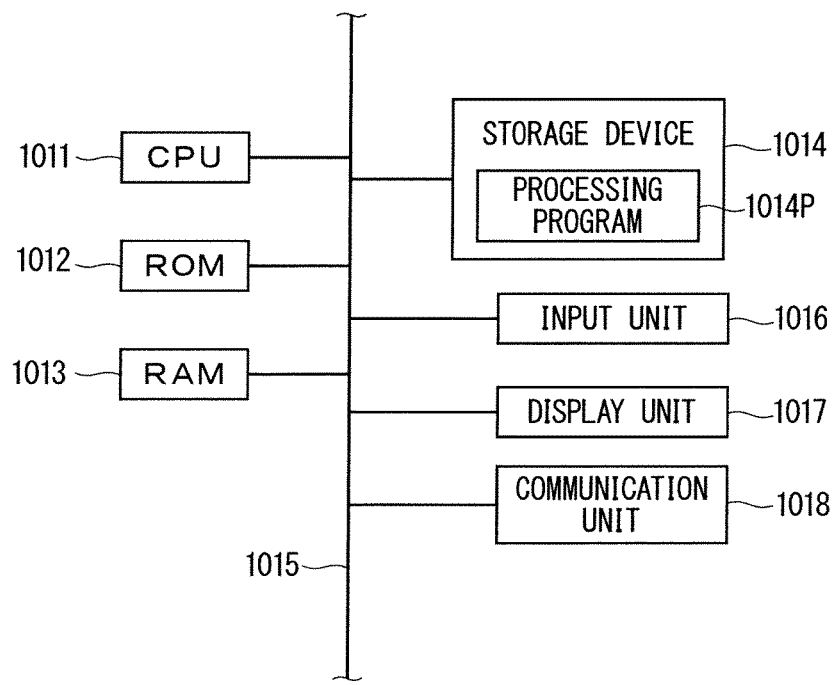
FIG. 2 is a block diagram conceptually illustrating a configuration of a control unit illustrated in FIG. 1.

FIG. 2 is a diagram conceptually illustrating an example configuration of the control unit 10 illustrated in FIG. 1. The control unit 10 controls the processing unit 110, the load port LP, the indexer robot IR, the center robot CR, and the like illustrated in FIG. 1. The control unit 10 may be configured with a general computer including an electric circuit. Specifically, the control unit 10 includes a central processing unit (CPU) 1011, a read-only memory (ROM) 1012, a random access memory (RAM) 1013, a storage device 1014, an input unit 1016, a display unit 1017, a communication unit 1018, and a bus line 1015 that interconnects these components.

The ROM 1012 stores a basic program. The RAM 1013 is used as a work area when the CPU 1011 performs predetermined processing. The storage device 1014 includes a non-volatile storage device such as a flash memory and a hard disk device. The input unit 1016 includes various switches, a touch panel, or the like, and receives a command of input setting such as a processing recipe from an operator. The display unit 1017 includes, for example, a liquid crystal display device, a lamp, and the like, and displays various types of information under the control of the CPU 1011. The communication unit 1018 has a function of exchanging data via a local area network (LAN) or the like.

Figure 3:
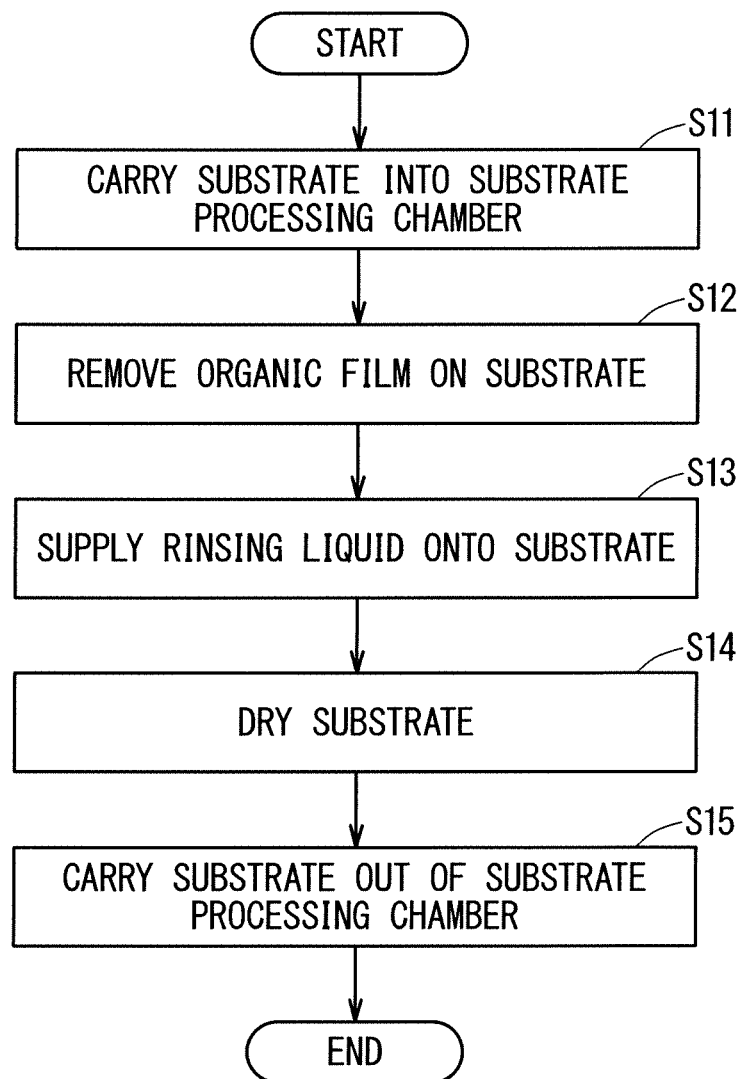
FIG. 3 is a flowchart schematically illustrating a substrate processing method using the substrate processing system in FIG. 1.

FIG. 3 is a flowchart schematically illustrating a substrate processing method using the substrate processing system 1 in FIG. 1. In step S11 (FIG. 3), by sequentially operating the indexer robot IR and the center robot CR, the substrate W provided with an organic film which is to be removed is carried into the substrate processing chamber of the processing unit 110 from the carrier C. In step S12 (FIG. 3), a step of removing the organic film on the substrate W (described in detail later) is performed. In step S13 (FIG. 3), a rinsing liquid is supplied to the substrate W to perform a rinsing process on the substrate W. In step S14 (FIG. 3), the substrate W is dried. In step S15 (FIG. 3), by sequentially operating the center robot CR and the indexer robot IR, the substrate is carried out of the substrate processing chamber of the processing unit 110 to the carrier C.

In the storage device 1014, a plurality of modes for controlling the components of the substrate processing system 1 in FIG. 1 are set in advance. By the CPU 1011 executing a processing program 1014P, one of a plurality of modes is selected, and the components are controlled under the selected mode. Note that, the processing program 1014P may be stored in a recording medium. Using this recording medium, the processing program 1014P can be installed in the control unit 10. Some or all of the functions that the control unit 10 executes are not necessarily implemented by software, but may be implemented by hardware such as a dedicated logic circuit.

First Preferred Embodiment

Figure 4:
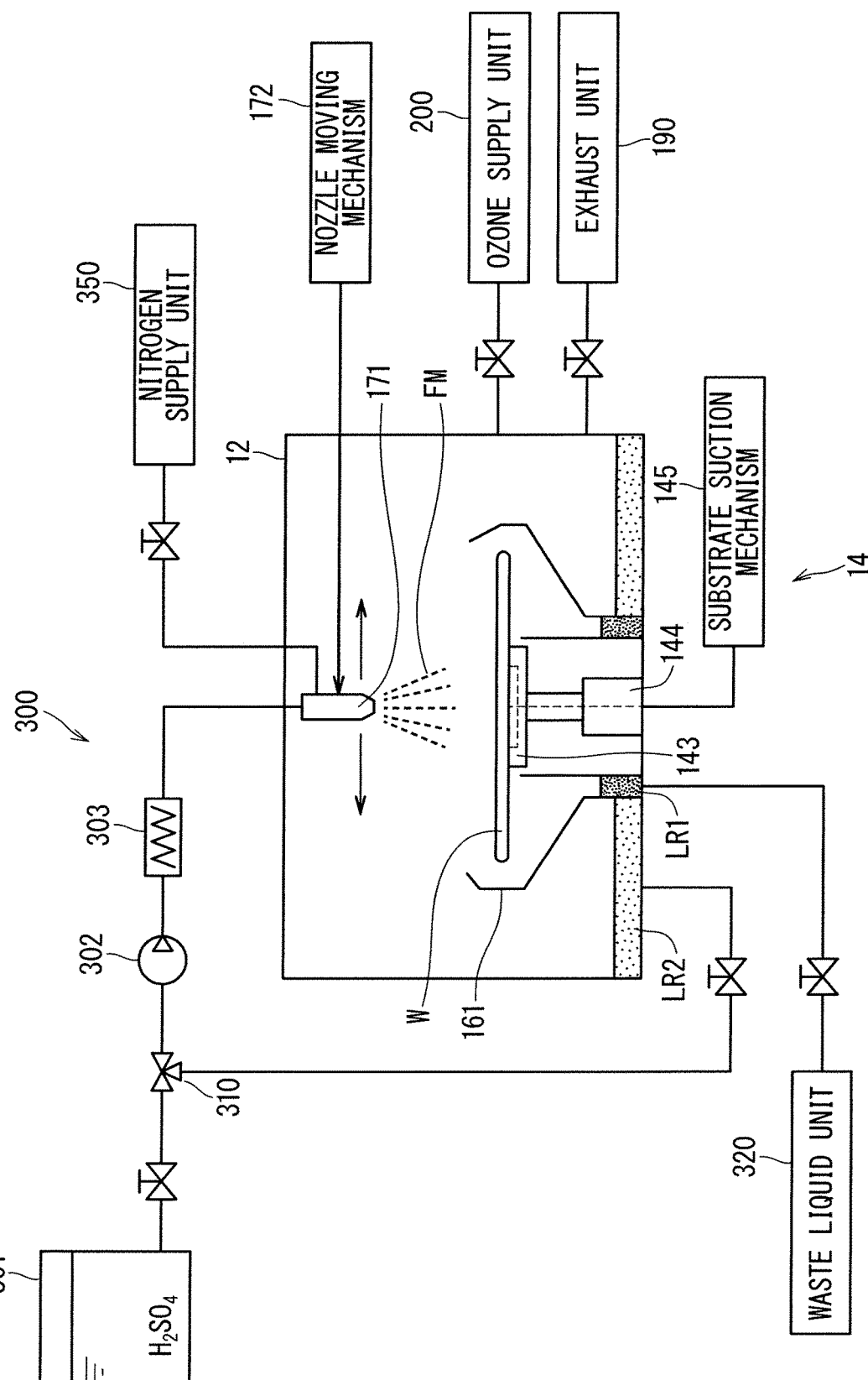
FIG. 4 is a cross-sectional view schematically illustrating a configuration of a substrate processing apparatus according to a first preferred embodiment.

Referring to FIG. 4, in a first preferred embodiment, a substrate processing apparatus 111 for removing an organic film (i.e., a resist film) on a substrate W is used as at least one of the processing units 110 (FIG. 1). The substrate processing apparatus 111 includes a chamber 12 (substrate processing chamber), a spin chuck 14 (substrate holding unit), an ozone supply unit 200, a chemical liquid supply unit 300, a nitrogen supply unit 350 (inert gas supply unit), a two-fluid nozzle 171 (atomization nozzle), a nozzle moving mechanism 172, a cup section 161, a waste liquid unit 320, and an exhaust unit 190.

The spin chuck 14 holds the substrate W in the chamber 12. The spin chuck 14 includes a spin base 143, a spin motor 144 that rotates the spin base 143 via a spin axis, and a substrate suction mechanism 145 that fixes the substrate W to the spin base 143 by suctioning the substrate W onto the spin base 143.

The ozone supply unit 200 supplies ozone-containing gas into the chamber 12. For this purpose, the ozone supply unit 200 has a pipe connected via a valve to a space in the chamber 12. An end of the pipe constituting the supply port for the ozone-containing gas is attached to the chamber 12 at a height preferably near the height of the upper surface of the substrate W, for example, slightly higher than the height of the upper surface of the substrate W. The ozone supply unit 200 may include a gas source that supplies oxygen or air, and an ozone generation device that ozonizes the gas from the gas source. The ozone concentration in the ozone-containing gas supplied from the ozone supply unit 200 is preferably 100 $g/m^3$ or more and 400 $g/m^3$ or less, more preferably 250 $g/m^3$ or more and 400 $g/m^3$ or less. The pressure of the ozone-containing gas supplied by the ozone supply unit 200 may be 0.1 MPa or more and 0.3 MPa or less.

The chemical liquid supply unit 300 includes a sulfuric acid tank 301, a pressure adjusting unit 302, and a heater 303. The chemical liquid supply unit 300 supplies chemical liquid containing sulfuric acid and heated by the heater 303 to the two-fluid nozzle 171. The heating temperature of the chemical liquid is preferably 70° C. or higher and 200° C. or lower. The pressure adjusting unit 302 adjusts the supply pressure to the two-fluid nozzle 171. The pressure adjusting unit 302 may be a pump or a regulator. The supply pressure of the chemical liquid to the two-fluid nozzle 171 is set higher than a threshold pressure which will be described later.

The nitrogen supply unit 350 supplies nitrogen ($N_2$) gas as an inert gas to the two-fluid nozzle 171. The supply pressure of the nitrogen gas to the two-fluid nozzle 171 is set higher than a threshold pressure which will be described later.

The two-fluid nozzle 171 is an atomization nozzle that sprays a chemical liquid onto the substrate W. The sprayed chemical liquid is supplied into the chamber 12 as fine particles FM. Spraying with the two-fluid nozzle 171 uses a high-speed gas flow supplied from the nitrogen supply unit 350, which easily makes the particles FM of the sprayed chemical liquid finer than the particles made by spraying using a single-flow nozzle. Thus, the sprayed chemical liquid can have a larger surface area. When there is a single-flow nozzle that can perform desirable spraying, such a single-flow nozzle that can atomize the chemical liquid may be used as an atomization nozzle without using the nitrogen supply unit 350 instead of using the two-fluid nozzle 171. The nozzle moving mechanism 172 horizontally moves the two-fluid nozzle 171. The nozzle moving mechanism 172 may include an arm that supports the two-fluid nozzle 171, and an actuator that drives the arm.

The cup section 161 surrounds the substrate W and the sides of the spin base 143 holding the substrate W. When the chemical liquid is sprayed toward the substrate W that is being rotated by the spin motor 144, the chemical liquid supplied onto the substrate W is shaken off into the surrounding of the substrate W. When the chemical liquid is supplied onto the substrate W, the upper end portion of the cup section 161 opened upward is positioned higher than the spin base 143. Thus, the chemical liquid that is discharged into the surrounding of the substrate W is received by the cup section 161. A first liquid LR1, which is a chemical liquid collected by being received by the cup section 161, is sent to the waste liquid unit 320. A second liquid LR2, which is a portion of the sprayed chemical liquid collected outside the cup section 161, can be returned to the chemical liquid supply unit 300 through a pipe provided with a valve. The pipe is connected to a pipe of the chemical liquid supply unit 300 by a three-way valve 310. By switching the three-way valve 310, the state switches between a state in which the chemical liquid supply unit 300 uses the chemical liquid in the sulfuric acid tank 301 and a state in which the chemical liquid supply unit 300 uses the second liquid LR2. It may be configured that a cup moving mechanism (not illustrated) lowers the cup section 161 to be lower than the spin base 143 when the function of the cup section 161 is not necessary.

The exhaust unit 190 has a pipe connected via a valve to the space in the chamber 12. When the valve is opened, the exhaust unit 190 discharges the atmosphere gas in the chamber 12 to the outside of the chamber 12. Although an end of the pipe constituting the exhaust port of the chamber 12 is attached to the chamber 12 in FIG. 4, the end of the pipe may be attached to the cup section 161 instead of the chamber 12. The exhaust unit 190 preferably includes an ozone-detoxifying device.

The control unit 10 (FIG. 1) controls the units of the substrate processing apparatus 111. In the preferred embodiment, the control unit 10 controls the ozone supply unit 200 to fill at least a space above the substrate W in the chamber 12 with ozone-containing gas, and then controls the chemical liquid supply unit 300 to start spraying the chemical liquid onto the substrate W through the space. Note that the control unit 10 may be regarded as a part of the substrate processing apparatus 111.

Hereinafter, SOM cleaning for removing an organic film on the substrate W by the substrate processing apparatus 111 (FIG. 4) as a process corresponding to step S12 (FIG. 3) will be described more specifically.

Figure 5:
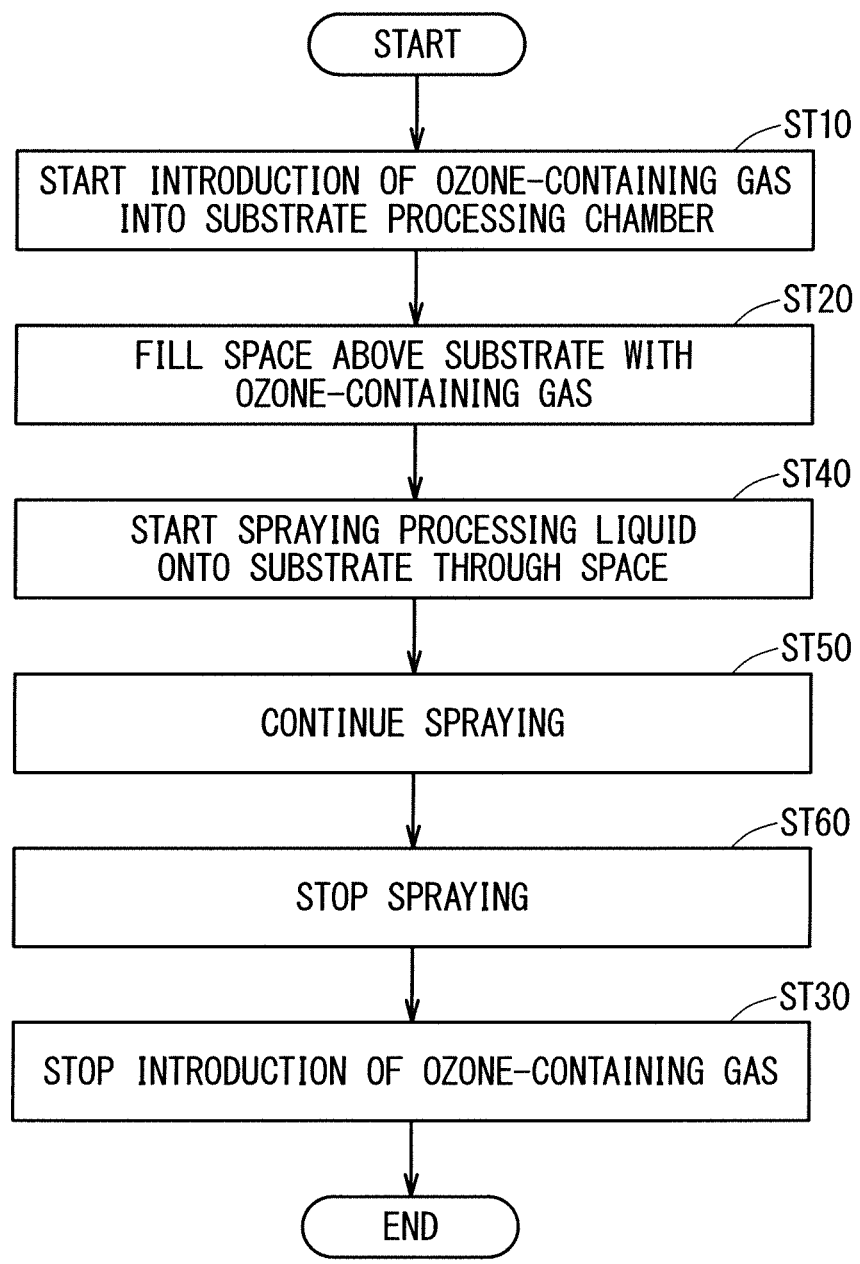
FIG. 5 is a flowchart schematically illustrating a substrate processing method according to the first preferred embodiment.

The substrate W is held by the spin chuck 14. In step ST10 (FIG. 5), the ozone supply unit 200 starts introducing ozone-containing gas into the chamber 12. By introducing the ozone-containing gas, at least the space above the substrate W in the chamber 12 is filled with ozone-containing gas in step ST20 (FIG. 5). Whether ozone-containing gas has filled may be defined by whether at least either of the pressure and ozone concentration in the chamber 12 is equal to or higher than a threshold. The threshold pressure is preferably 0.1 MPa or more and 0.3 MPa or less. The threshold concentration is preferably 100 $g/m^3$ or more and 400 $g/m^3$ or less, more preferably 250 $g/m^3$ or more and 400 $g/m^3$ or less. In the preferred embodiment, it is not always necessary to obtain a measured value to be compared with the threshold. Such a process to confirm whether the measured value is equal to or more than the threshold may be performed. In this case, a pressure gauge 250 (see FIG. 6) described later or an ozone concentration gauge is provided to the chamber 12 for measurement.

Before step ST40 (FIG. 5) to be described later, the spin chuck 14 starts rotating the substrate W. After step ST20 described above, in step ST40 (FIG. 5), the chemical liquid supply unit 300 supplies heated chemical liquid containing sulfuric acid to the two-fluid nozzle 171, and the nitrogen supply unit supplies nitrogen gas. This starts spraying of the heated chemical liquid containing sulfuric acid onto the substrate W through the space already filled with ozone-containing gas as described above. Sulfuric acid in the sprayed chemical liquid reacts with ozone in the space, and thereby active species, specifically, $S_2O_8^{2-}$ are generated. In step ST50 (FIG. 5), the spraying started in step ST40 continues.

In step ST60 (FIG. 5), the spraying continued in step ST50 is stopped. Specifically, the chemical liquid supply unit 300 stops supplying the chemical liquid to the two-fluid nozzle 171, and the nitrogen supply unit 350 stops supplying nitrogen gas. The timing of stopping the spraying may be, for example, when a predetermined time has elapsed since the time point at which the spraying has started. In another example, the timing of stopping the spraying may be determined by referring to monitoring means for recognizing the progress of the substrate processing. In the preferred embodiment, after the ozone-containing gas has been introduced into the chamber 12 in step ST10 and step ST20 (FIG. 5), the introduction is continued also in step ST40 and step ST50. In other words, supplying of fresh ozone-containing gas continues during spraying. Simultaneously with or after step ST60, in step ST30, the ozone supply unit 200 stops introducing ozone-containing gas.

The SOM cleaning is performed as described above. Note that, the SOM cleaning described above is the substrate processing that at least partially removes an organic film. An additional cleaning may be performed if there is a remaining portion of an organic film immediately after the SOM cleaning. This additional substrate processing may be, for example, SPM cleaning or SC1 cleaning. The same can be said for other preferred embodiments described later.

The chemical liquid sprayed in step ST50 (FIG. 5) is separated into the first liquid LR1 collected by being received by the cup section 161 surrounding the substrate W and the second liquid LR2 collected outside the cup section 161. After that, the second liquid LR2 not containing the first liquid LR1 may be sprayed again. Specifically, by switching the three-way valve 310, the state is switched from the state in which the chemical liquid supply unit 300 uses the chemical liquid in the sulfuric acid tank 301 to the state in which the second liquid LR2 is used. The second liquid LR2 may be sprayed again to the substrate W that has been subjected to the processing with the second liquid LR2 simultaneously being collected or to a different substrate W. These features may also be applied to the second preferred embodiment described later.

Second Preferred Embodiment

Figure 6:
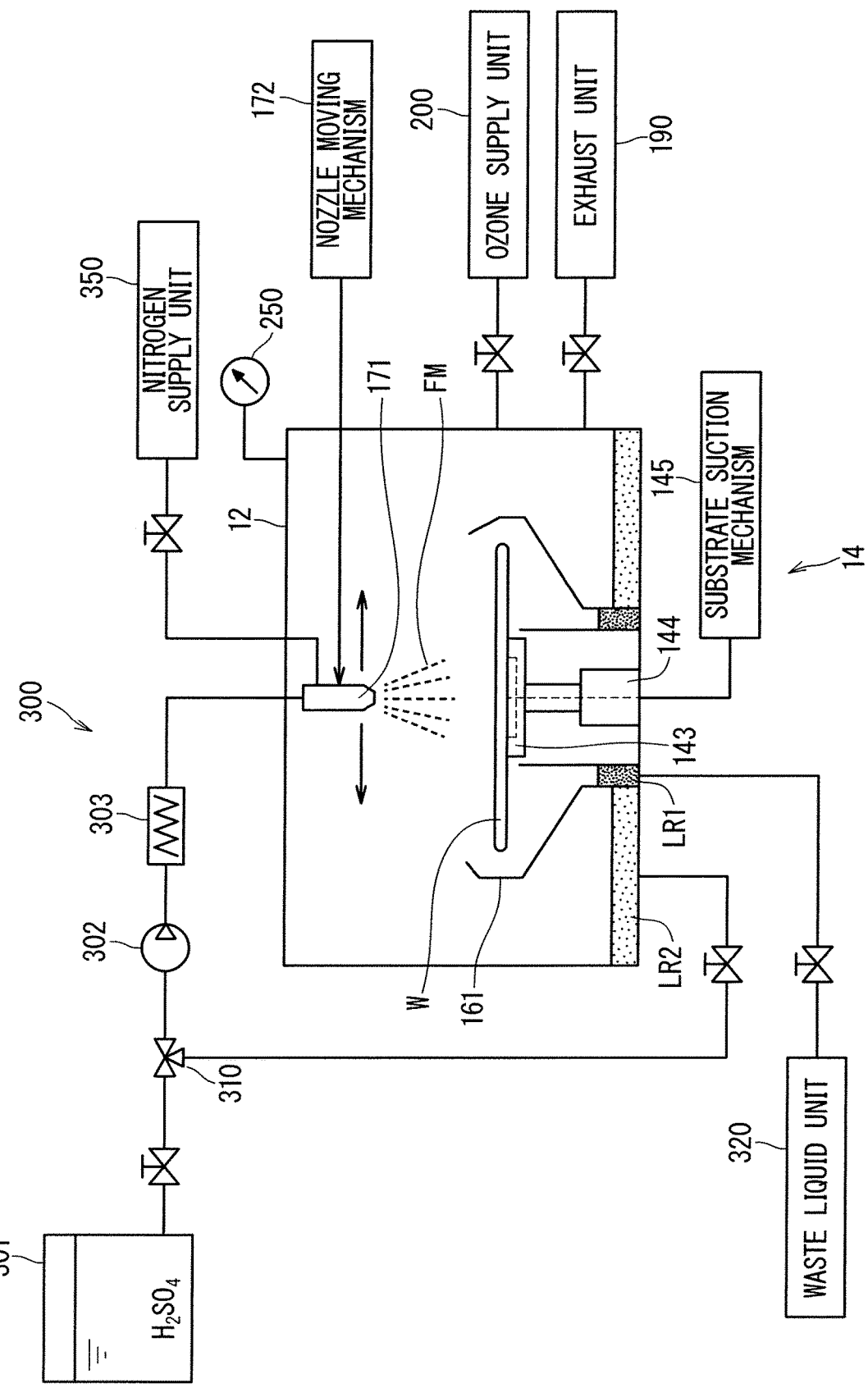
FIG. 6 is a cross-sectional view schematically illustrating a configuration of a substrate processing apparatus according to a second preferred embodiment.

Referring to FIG. 6, in a second preferred embodiment, a substrate processing apparatus 112 for removing an organic film on a substrate W is applied as at least one of the processing units 110 (FIG. 1). The substrate processing apparatus 112 includes, besides the configuration of the substrate processing apparatus 111 (FIG. 4: first preferred embodiment), a pressure gauge 250 that measures the pressure in a chamber 12.

Hereinafter, SOM cleaning for removing an organic film on the substrate W by the substrate processing apparatus 112 (FIG. 6) as a process corresponding to step S12 (FIG. 3) will be described more specifically.

Figure 7:
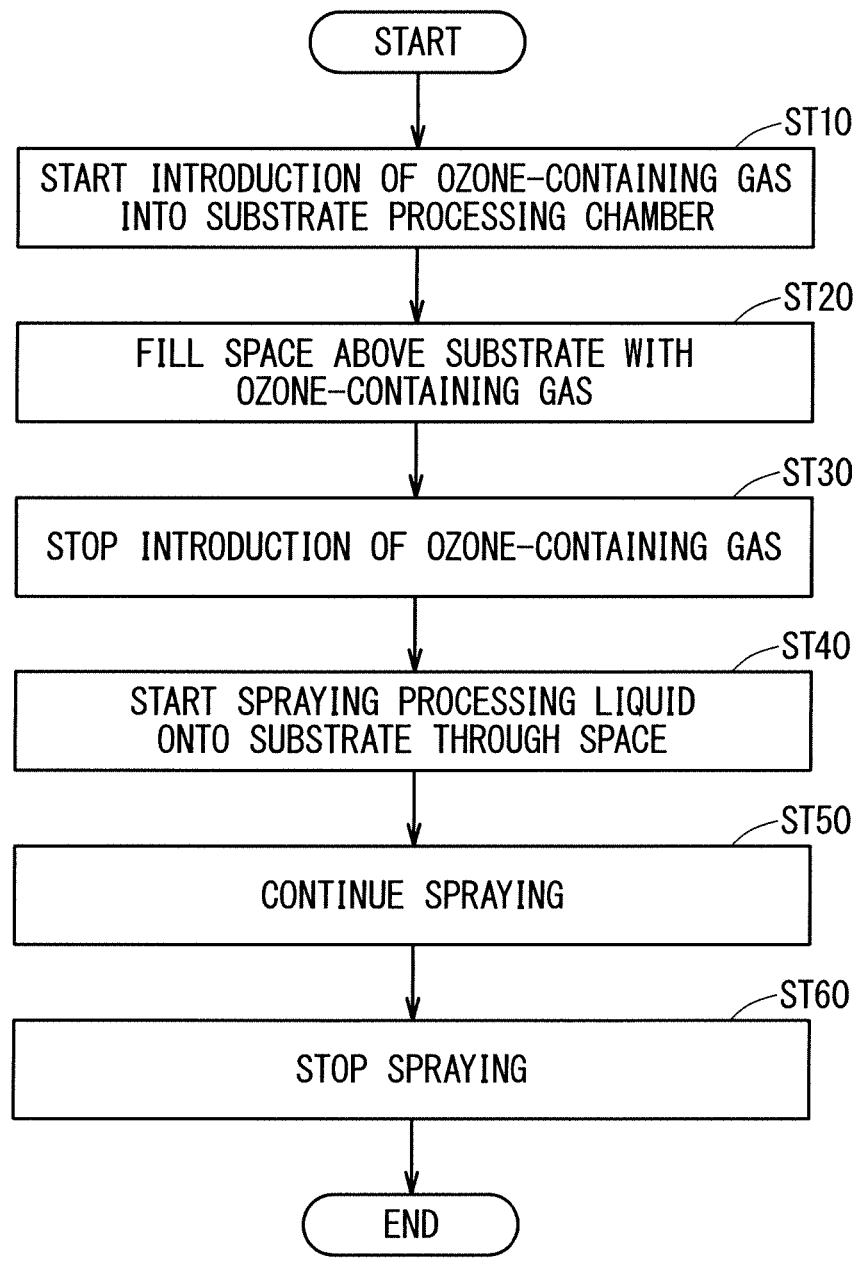
FIG. 7 is a flowchart schematically illustrating a substrate processing method according to the second preferred embodiment.

The substrate W is held by a spin chuck 14. In step ST10 (FIG. 7), an ozone supply unit 200 starts introducing ozone-containing gas into the chamber 12. By introducing the ozone-containing gas, at least a space above the substrate W in the chamber 12 is filled with ozone-containing gas in step ST20 (FIG. 7). In the preferred embodiment, it is confirmed in step ST20 that a measured pressure value obtained by the pressure gauge 250 is equal to or higher than a predetermined threshold pressure. With or instead of this confirmation, confirmation be made that a measured ozone concentration value in the chamber 12 is equal to or higher than a predetermined threshold concentration. In this case, an ozone concentration gauge (not illustrated) is provided to the chamber 12. Appropriate ranges of the threshold pressure and threshold concentration are respectively similar to those described in the first preferred embodiment.

After step ST20, in step ST30 (FIG. 7), the ozone supply unit 200 stops introducing ozone-containing gas. In other words, introduction of ozone-containing gas is stopped after confirming that at least either of the pressure and ozone concentration in the chamber 12 is sufficiently high. Step ST30 is performed before step ST50 described later. Step ST30 may be performed before step ST40 described later.

Before step ST40 (FIG. 7), the spin chuck 14 starts rotating the substrate W. After step ST20 described above, in step ST40 (FIG. 7), a chemical liquid supply unit 300 supplies heated chemical liquid containing sulfuric acid to a two-fluid nozzle 171, and a nitrogen supply unit supplies nitrogen gas. This starts spraying of the heated chemical liquid containing sulfuric acid onto the substrate W through the space already filled with ozone-containing gas as described above. Sulfuric acid in the sprayed chemical liquid reacts with ozone in the space, and thereby active species, specifically, $S_2O_8^{2-}$ are generated. In step ST50 (FIG. 7), the spraying started in step ST40 continues.

In step ST60 (FIG. 7), the spraying continued in step ST50 is stopped. Specifically, the chemical liquid supply unit 300 stops supplying the chemical liquid to the two-fluid nozzle 171, and the nitrogen supply unit 350 stops supplying nitrogen gas. The timing of stopping the spraying may be, for example, when a predetermined time has elapsed since the time point at which the spraying has started. In another example, the timing of stopping the spraying may be determined by referring to monitoring means for recognizing the progress of the substrate processing.

In the preferred embodiment, after the ozone-containing gas has been introduced into the chamber 12 in step ST10 and step ST20 (FIG. 7), this introduction is stopped before step ST50. In other words, there is a period during spraying when fresh ozone-containing gas is not supplied. This introduction may be stopped before step ST40. In other words, fresh ozone-containing gas may not be supplied at all during spraying.

Third Preferred Embodiment

Figure 8:
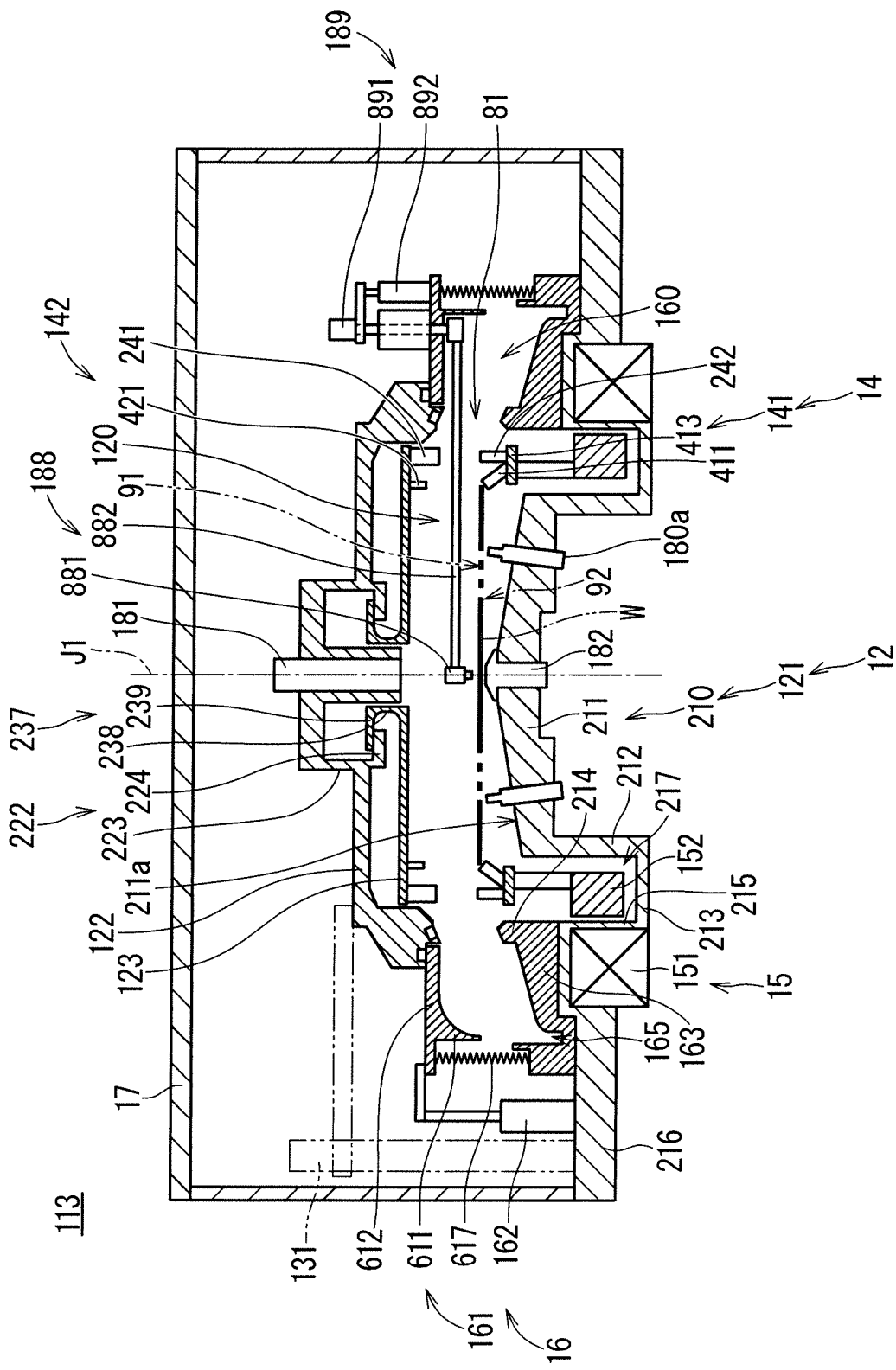
FIG. 8 is a cross-sectional view schematically illustrating a configuration of a substrate processing apparatus according to a third preferred embodiment.

Referring to FIG. 8, in a third preferred embodiment, a substrate processing apparatus 113 for removing an organic film on a substrate W is applied as at least one of the processing units 110 (FIG. 1). The substrate processing apparatus 113 is a single wafer processing apparatus that processes one substantially disk-shaped substrates W at a time. In FIG. 8, hatching is omitted in a cross section of a portion of the configuration of the substrate processing apparatus 113 (the same applies to other cross-sectional views).

The substrate processing apparatus 113 includes a chamber 12, a top plate 123, a chamber open-and-close mechanism 131, a substrate holding unit 14, a substrate rotating mechanism 15, a liquid receiving unit 16, and a cover 17. The cover 17 covers the top and sides of the chamber 12.

The chamber 12 includes a chamber body 121, and a chamber lid 122. The chamber 12 has a substantially cylindrical shape centered on a center axis J1 along the up-down direction. The chamber body 121 includes a chamber bottom 210, and a chamber side wall 214. The chamber bottom 210 includes a substantially disk-shaped central portion 211, a substantially cylindrical inner wall portion 212 extending downward from the outer rim of the central portion 211, a substantially annular plate-shaped annular bottom portion 213 extending radially outward from the lower end of the inner wall portion 212, a substantially cylindrical outer wall portion 215 extending upward from the outer rim of the annular bottom portion 213, and a substantially annular plate-shaped base portion 216 extending radially outward from the upper end portion of the outer wall portion 215.

The chamber side wall 214 has an annular shape centered on the center axis J1. The chamber side wall 214 protrudes upward from the inner rim of the base portion 216. A member forming the chamber side wall 214 also serves as a part of the liquid receiving unit 16 as described later. In the following description, a space surrounded by the chamber side wall 214, the outer wall portion 215, the annular bottom portion 213, the inner wall portion 212, and the outer rim of the central portion 211 is referred to as a lower annular space 217.

When the substrate W is supported by a substrate support portion 141 (described later) of the substrate holding unit 14, a lower surface 92 of the substrate W faces the upper surface of the central portion 211 of the chamber bottom 210. In the following description, the central portion 211 of the chamber bottom 210 is referred to as a "lower surface opposing portion 211", and an upper surface 211a of the central portion 211 is referred to as an "opposing surface 211a". Details of the lower surface opposing portion 211 will be described later.

The chamber lid 122 has a substantially disk shape perpendicular to the center axis J1 and includes an upper portion of the chamber 12. The chamber lid 122 closes an upper opening of the chamber body 121. FIG. 8 illustrates the chamber lid 122 separated from the chamber body 121. When the chamber lid 122 closes the upper opening of the chamber body 121, the outer rim of the chamber lid 122 is in contact with the upper portion of the chamber side wall 214.

The chamber open-and-close mechanism 131 moves the chamber lid 122, which is a movable part of the chamber 12, in the up-down direction relative to the chamber body 121, which is another part of the chamber 12. The chamber open-and-close mechanism 131 is a lid lifting-and-lowering mechanism that lifts and lowers the chamber lid 122. When the chamber lid 122 is moved in the up-down direction by the chamber open-and-close mechanism 131, the top plate 123 also moves in the up-down direction together with the chamber lid 122. By the chamber lid 122 coming into contact with the chamber body 121 to close the upper opening and being pressed against the chamber body 121, a sealed chamber space 120 (see FIG. 13) is formed in the chamber 12. In other words, the upper opening of the chamber body 121 is closed by the chamber lid 122, whereby the chamber space 120 is sealed.

The substrate holding unit 14 is disposed in the chamber space 120 and holds the substrate W in a horizontal state. That is, the substrate W is held by the substrate holding unit 14 in a state where the upper surface 91 is perpendicular to the center axis J1 and facing upward. The substrate holding unit 14 includes the substrate support portion 141, described above, that supports the outer rim (i.e., a portion including the outer peripheral edge and the vicinity thereof) of the substrate W from below, and a substrate pressing portion 142 that presses from above the outer rim of the substrate W supported by the substrate support portion 141. The substrate support portion 141 includes a substantially annular plate-shaped support base 413 centered on the center axis J1, and a plurality of first contact portions 411 fixed to the upper surface of the support base 413. The substrate pressing portion 142 includes a plurality of second contact portions 421 fixed to the lower surface of the top plate 123. In fact, circumferential positions of a plurality of second contact portions 421 are different from the circumferential positions of a plurality of first contact portions 411.

The top plate 123 has a substantially disk shape perpendicular to the center axis J1. The top plate 123 is disposed below the chamber lid 122 and above the substrate support portion 141. The top plate 123 has an opening at its center. When the substrate W is supported by the substrate support portion 141, the upper surface 91 of the substrate W faces the lower surface of the top plate 123 perpendicular to the center axis J1. The diameter of the top plate 123 is larger than the diameter of the substrate W, and the outer peripheral edge of the top plate 123 is on the radially outer side of the outer peripheral edge of the substrate W over the entire circumference.

In the state illustrated in FIG. 8, the top plate 123 is supported so as to be suspended by the chamber lid 122. The chamber lid 122 includes at its central portion a substantially annular plate holding portion 222. The plate holding portion 222 includes a substantially cylindrical sleeve portion 223 centered on the center axis J1, and a substantially disk-shaped flange portion 224 centered on the center axis J1. The flange portion 224 extends radially inward from the lower end of the sleeve portion 223. The top plate 123 includes an annular held portion 237. The held portion 237 includes a substantially cylindrical sleeve portion 238 centered on the center axis J1, and a substantially disk-shaped flange portion 239 centered on the center axis J1. The sleeve portion 238 extends upward from the upper surface of the top plate 123. The flange portion 239 extends radially outward from the upper end of the sleeve portion 238. The sleeve portion 238 is on the radially inner side of the sleeve portion 223 of the plate holding portion 222. The flange portion 239 is located above the flange 224 of the plate holding portion 222 and faces the flange 224 along the up-down direction. By the lower surface of the flange portion 239 of the held portion 237 coming in contact with the upper surface of the flange portion 224 of the plate holding portion 222, the top plate 123 is attached to the chamber lid 122 so as to be suspended from the chamber lid 122.

The substrate rotating mechanism 15 illustrated in FIG. 8 is a so-called hollow motor. The substrate rotating mechanism 15 includes an annular stator 151 centered on the center axis J1, and an annular rotor 152. The rotor 152 includes a substantially annular permanent magnet. PTFE resin is molded to the surface of the permanent magnet. The rotor 152 is disposed in the lower annular space 217 in the chamber space 120 of the chamber 12. The support base 413 of the substrate support portion 141 is attached to the upper portion of the rotor 152 via a connection member. The support base 413 is disposed above the rotor 152. The stator 151 is disposed outside the chamber 12 (that is, in the outside of the chamber space 120) around the rotor 152, that is, on the radially outer side of the chamber 12. In the preferred embodiment, the stator 151 is fixed to the outer wall portion 215 and the base portion 216 of the chamber bottom 210, and is located below the liquid receiving unit 16. The stator 151 includes a plurality of coils disposed in a circumferential arrangement centered on the center axis J1. By supplying a current to the stator 151, rotational force about the center axis J1 is generated between the stator 151 and the rotor 152. The rotor 152 is thereby rotated in a horizontal state about the center axis J1. The magnetic force acting between the stator 151 and the rotor 152 causes the rotor 152 to float in the chamber 12 without directly or indirectly contacting the chamber 12 and rotate the substrate W with the substrate support portion 141 in a floating state about the center axis J1.

The liquid receiving unit 16 includes a cup section 161, a cup section moving mechanism 162, and a cup facing section 163. The cup section 161 has an annular shape centered on the center axis J1, and is provided on the radially outer side of the chamber 12 over the entire circumference. The cup section moving mechanism 162 moves the cup section 161 in the up-down direction. The cup section moving mechanism 162 is disposed on the radially outer side of the cup section 161. The cup section moving mechanism 162 is disposed at a circumferential position different from that of the chamber open-and-close mechanism 131. The cup facing section 163 is positioned below the cup section 161 and faces the cup section 161 along the up-down direction. The cup facing section 163 is a portion of a member forming the chamber side wall 214. The cup facing section 163 has an annular liquid receiving recess 165 positioned on the radially outer side of the chamber side wall 214.

The cup section 161 includes a side wall portion 611, an upper surface portion 612, and a bellows 617. The side wall portion 611 has a substantially cylindrical shape centered on the center axis J1. The upper surface portion 612 has a substantially annular plate shape centered on the center axis J1, and extends radially inward and radially outward from the upper end portion of the side wall portion 611. The lower portion of the side wall portion 611 can be positioned in the liquid receiving recess 165 of the cup facing section 163. The side wall portion 611 has different cross-sectional shapes at a portion where a nozzle unit 188, described later, is accommodated (the right portion in FIG. 8) and at other portions (the left portion in FIG. 8). The right portion of the side wall portion 611 in FIG. 8 has a slightly smaller thickness in the radial direction than the left portion in FIG. 8.

The bellows 617 has a substantially cylindrical shape centered on a center axis J1 and can extend and contract along the up-down direction. The bellows 617 is provided on the radially outer side of and around the entire circumference of the side wall portion 611. The bellows 617 is made of a material that does not allow gas and/or liquid to pass therethrough. The upper end portion of the bellows 617 is connected to the lower surface of the outer rim of the upper surface portion 612 over the entire circumference. In other words, the upper end portion of the bellows 617 is indirectly connected to the side wall portion 611 via the upper surface portion 612. A connecting portion between the bellows 617 and the upper surface portion 612 is sealed to prevent gas and/or liquid from passing therethrough. The lower end portion of the bellows 617 is indirectly connected to the chamber body 121 via the cup facing section 163. A connecting portion between the lower end portion of the bellows 617 and the cup facing section 163 is also sealed to prevent gas and/or liquid from passing therethrough.

An upper nozzle 181 is fixed to the center of the chamber lid 122. The upper nozzle 181 can be inserted into a central opening of the top plate 123. The upper nozzle 181 has a liquid discharge port at its center and jet port(s) around the liquid discharge port. A lower nozzle 182 is attached to the center of the lower surface opposing portion 211 of the chamber bottom 210. A plurality of gas jet nozzles 180a is also attached to the lower surface opposing portion 211. A plurality of gas jet nozzles 180a is, for example, circumferentially arranged about the center axis J1 at a constant angular interval. Note that, the upper nozzle 181 and the lower nozzle 182 are not necessarily positioned in the central portion, but may be positioned, for example, at locations facing the outer rim of the substrate W.

The nozzle unit 188 is attached to the upper surface portion 612 of the cup section 161. The nozzle unit 188 includes an atomization nozzle 881 that sprays a chemical liquid, and a nozzle support 882. The nozzle support 882 is a rod member extending in a substantially horizontal direction. A fixed end portion, which is an end portion of the nozzle support 882, is attached to a lower surface of the upper surface portion 612 of the cup section 161. The atomization nozzle 881 is fixed to a free end, which is the other end, of the nozzle support 882. In an exemplary modification, the two-fluid nozzle 171 (FIG. 4) may be provided together with the nitrogen supply unit 350 (FIG. 4) instead of the atomization nozzle 881, which is a single-flow nozzle.

A nozzle moving mechanism 189 is provided at an upper portion of the cup section 161. Above the fixed end portion of the nozzle support 882, the nozzle moving mechanism 189 is fixed to the upper surface of the upper surface portion 612 of the cup section 161. The nozzle moving mechanism 189 includes a support rotating mechanism 891, and a support lifting mechanism 892. The support rotating mechanism 891 penetrates the upper surface portion 612 of the cup section 161 to be connected to the fixed end portion of the nozzle support 882, and rotates the nozzle support 882 together with the atomization nozzle 881 about the fixed end portion in a substantially horizontal direction. A portion where the support rotating mechanism 891 penetrates the cup section 161 is sealed to prevent gas and/or liquid from passing therethrough. The support lifting mechanism 892 moves the fixed end portion of the nozzle support 882 in the up-down direction to lift and lower the nozzle support 882 and the atomization nozzle 881. The nozzle moving mechanism 189 moves in the up-down direction together with the cup section 161 by the cup section moving mechanism 162.

Figure 9:
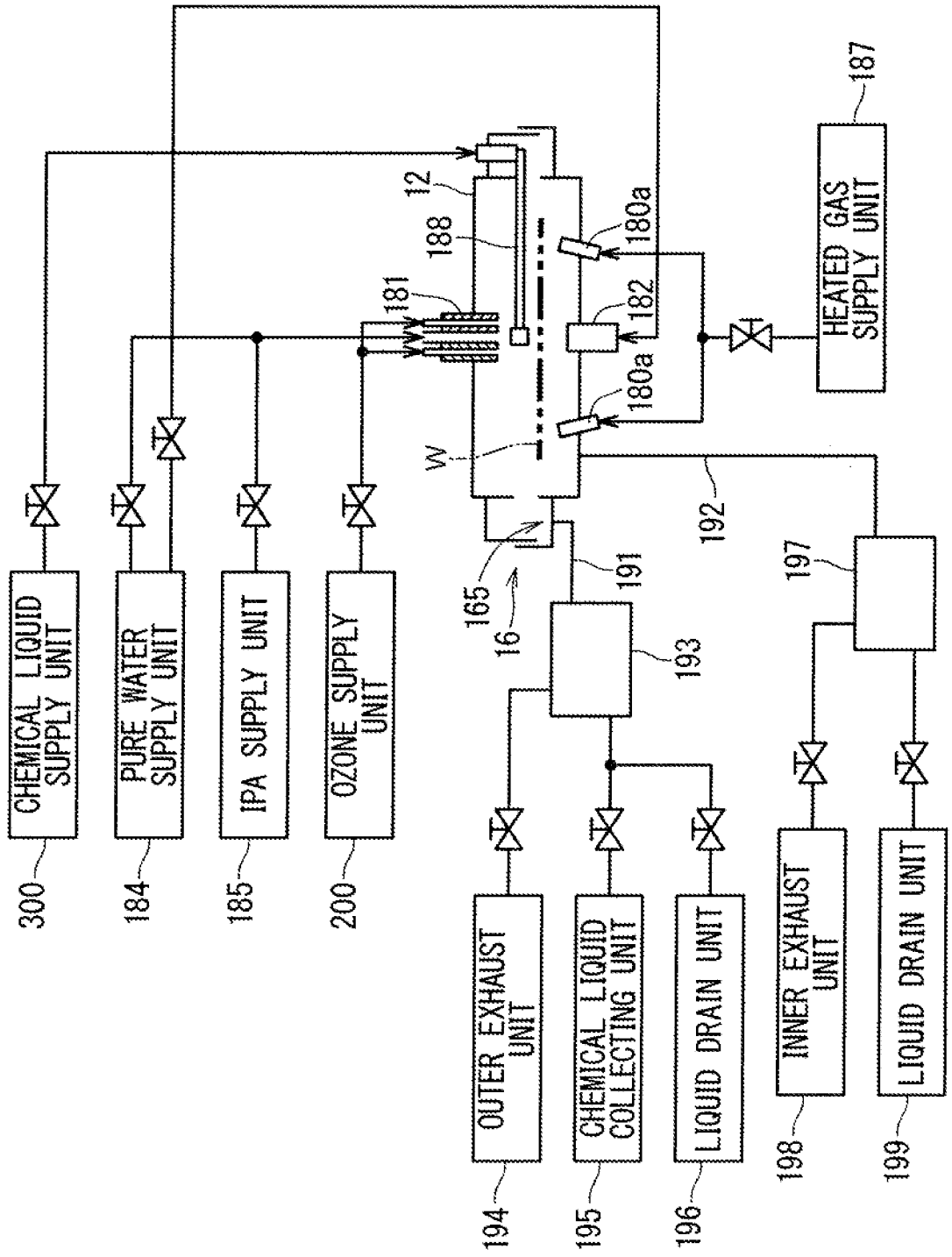
FIG. 9 is a block diagram schematically illustrating configurations of a gas-liquid supply unit and a gas-liquid discharge unit provided in the substrate processing apparatus illustrated in FIG. 8.

FIG. 9 is a block diagram illustrating a gas-liquid supply unit and a gas-liquid discharge unit included in the substrate processing apparatus 113. The gas-liquid supply unit includes, besides the nozzle unit 188, the gas jet nozzles 180a, the upper nozzle 181, and the lower nozzle 182 described above, an ozone supply unit 200, a chemical liquid supply unit 300, a pure water supply unit 184, an IPA supply unit 185, and a heated gas supply unit 187. The chemical liquid supply unit 300 is connected to the nozzle unit 188 via a valve. Each of the pure water supply unit 184 and the IPA supply unit 185 is connected via a nozzle to the upper nozzle 181. The lower nozzle 182 is connected to the pure water supply unit 184 via a valve. The upper nozzle 181 is also connected to the ozone supply unit 200 via a valve. The upper nozzle 181 is a part of a gas supply unit that supplies gas into the chamber 12. A plurality of gas jet nozzles 180a is connected to the heated gas supply unit 187 via a valve.

A first discharge path 191 connected to the liquid receiving recess 165 of the liquid receiving unit 16 is connected to a gas-liquid separation unit 193. The gas-liquid separation unit 193 is connected to an outer exhaust unit 194, a chemical liquid collecting unit 195, and a liquid drain unit 196 each via a valve. A second discharge path 192 connected to the chamber bottom 210 is connected to a gas-liquid separation unit 197. The gas-liquid separation unit 197 is connected to an inner exhaust unit 198 and a liquid drain unit 199 each via a valve.

The chemical liquid supply unit 300 supplies heated chemical liquid containing sulfuric acid as in the description on the substrate processing apparatus 111 (FIG. 4: the first preferred embodiment). The pure water supply unit 184 supplies deionized water (DIW) to the substrate W via the upper nozzle 181 or the lower nozzle 182. The IPA supply unit 185 supplies isopropyl alcohol (IPA) onto the substrate W via the upper nozzle 181. The substrate processing apparatus 113 may be provided with a processing liquid supply unit that supplies a processing liquid other than the processing solutions described above (chemical liquid, pure water, and IPA).

The ozone supply unit 200 supplies ozone-containing gas into the chamber 12 as in the description on the substrate processing apparatus 111 (FIG. 4: the first preferred embodiment). This supplying is performed via the upper nozzle 181 in the preferred embodiment. The heated gas supply unit 187 supplies heated gas (i.e., a high-temperature inert gas heated to 160 to 200° C.) to the lower surface 92 of the substrate W via a plurality of gas jet nozzles 180a. In the preferred embodiment, the gas used in the heated gas supply unit 187 is nitrogen gas, but may not be nitrogen gas. When an inert gas heated in the heated gas supply unit 187 is used, explosion prevention measures of the substrate processing apparatus 113 may be simplified or omitted.

As illustrated in FIG. 8, a plurality of first engagement portions 241 is arranged along the circumferential direction on the lower surface of the outer rim of the top plate 123, and a plurality of second engagement portions 242 is arranged along the circumferential direction on the upper surface of the support base 413. Actually, the first engagement portions 241 and the second engagement portions 242 are arranged at circumferential positions different from those of a plurality of first contact portions 411 of the substrate support portion 141 and a plurality of second contact portions 421 of the substrate pressing portion 142. It is preferable that three or more sets of the engagement portions are provided. The preferred embodiment is provided with four sets. The first engagement portion 241 has in the lower portion thereof a recess that is recessed upward. The second engagement portion 242 protrudes upward from the support base 413.

Hereinafter, a substrate processing method for removing an organic film on the substrate W using the substrate processing apparatus 113 (FIGS. 8 and 9) will be described.

Figure 10:
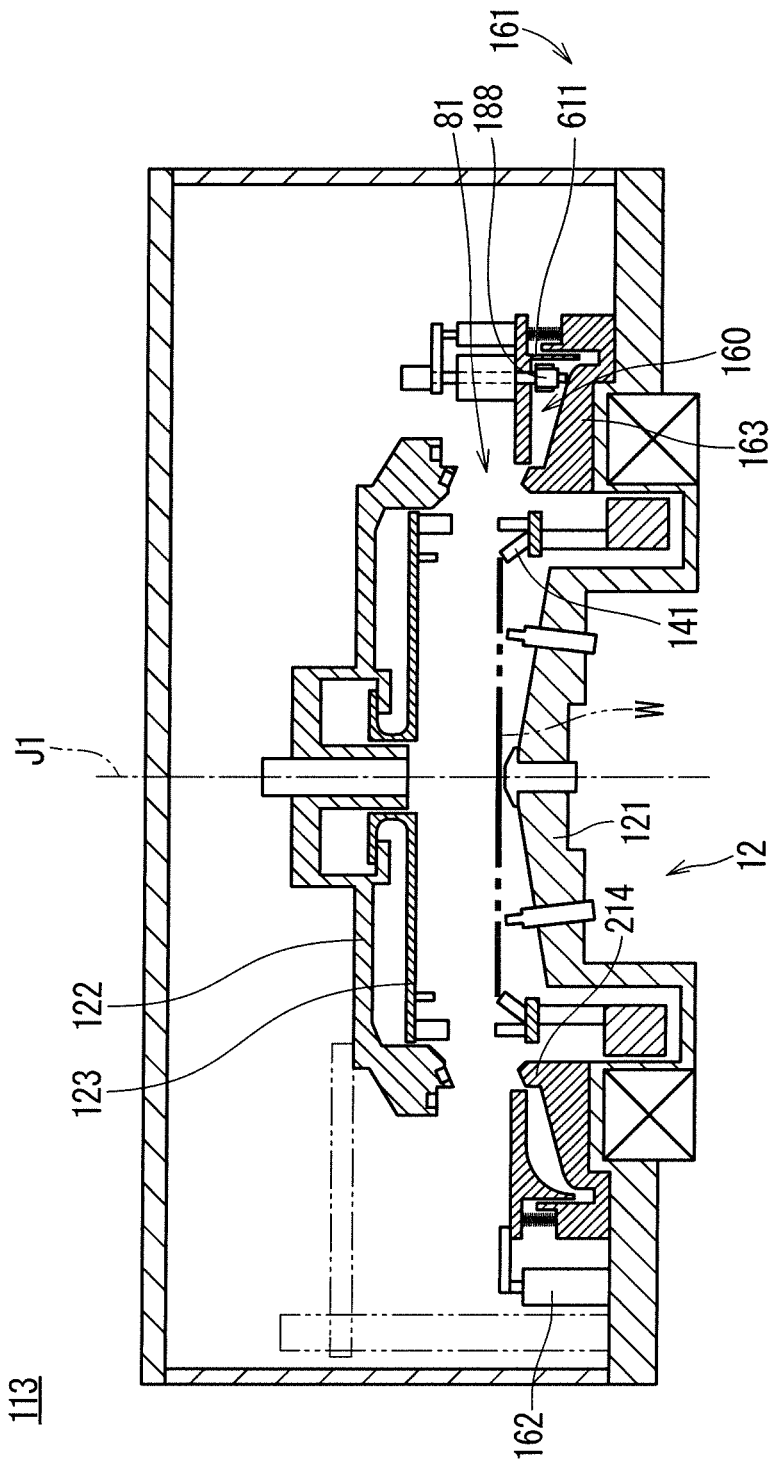
FIG. 10 is a cross-sectional view schematically illustrating a step in a substrate processing method according to the third preferred embodiment.

In step S11 (FIG. 3) as illustrated in FIG. 10, with the chamber lid 122 separately positioned above the chamber body 121 and the cup section 161 separately positioned below the chamber lid 122, the substrate W is carried into the chamber 12 by an external carrying mechanism and supported by the substrate support portion 141 from below. Hereinafter, the state of the chamber 12 and the cup section 161 illustrated in FIG. 10 is referred to as an "open state". The opening between the chamber lid 122 and the chamber side wall 214 has an annular shape centered on the center axis J1, and will be hereinafter referred to as an "annular opening 81". In the substrate processing apparatus 113, the annular opening 81 is created around (that is, on the radially outer side of) the substrate W by the chamber lid 122 being separated from the chamber body 121. In step S11, the substrate W is carried in through the annular opening 81.

Figure 11:
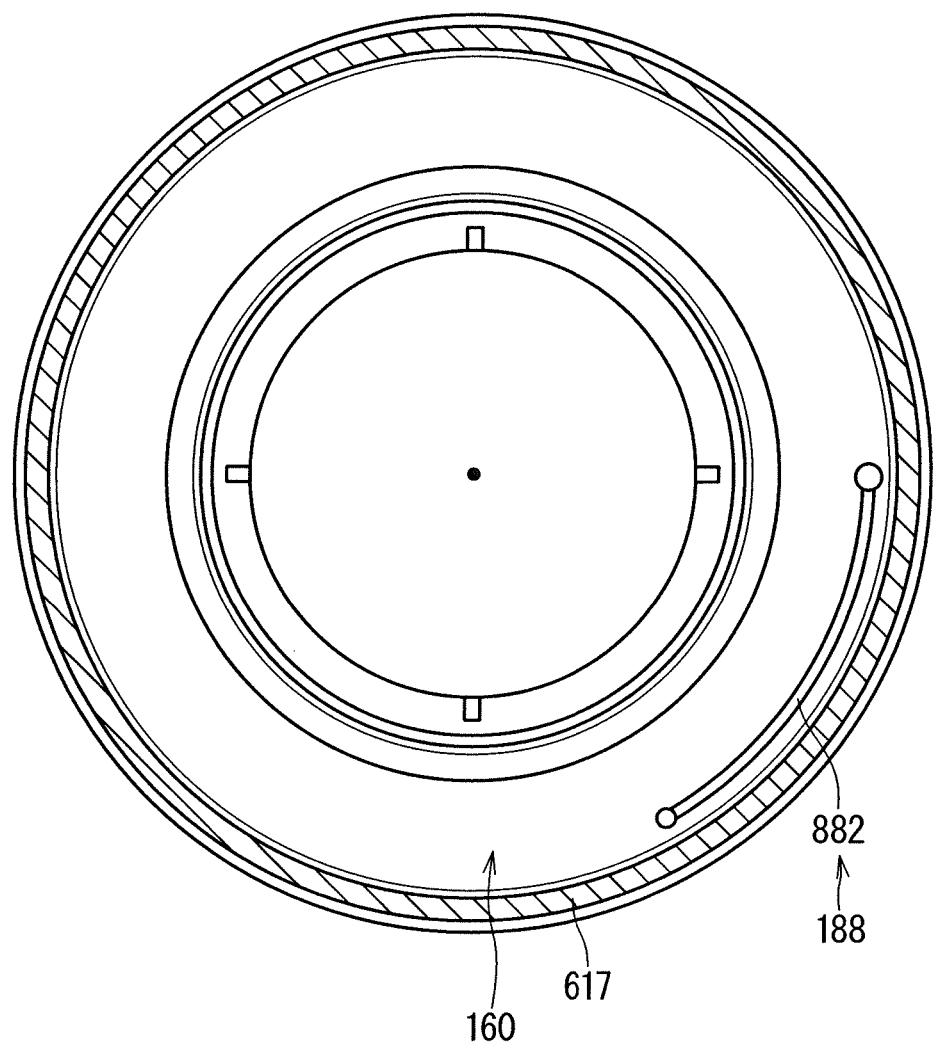
FIG. 11 is a plan view schematically illustrating a step in the substrate processing method according to the third preferred embodiment.

At the time of carrying in the substrate W, the nozzle unit 188 is already accommodated in a space 160 between the cup section 161 and the cup facing section 163. The space 160 is a substantially annular space surrounding the entire outer periphery of the chamber 12. In the following description, the space 160 is referred to as a "side space 160". FIG. 11 is a plan view of the substrate processing apparatus 113. In FIG. 11, illustration of the chamber lid 122, the cup section 161, and the like is omitted to facilitate understanding of the accommodated state of the nozzle unit 188. The bellows 617 is hatched in FIG. 11.

As illustrated in FIG. 11, the nozzle support 882 of the nozzle unit 188 is curved to swell radially outer side in a plan view. In other words, the nozzle unit 188 has a substantially arc shape. In the side space 160, the nozzle unit 188 is disposed so as the nozzle support 882 to extend along the bellows 617 and the side wall portion 611 of the cup section 161 (see FIG. 10).

To accommodate the nozzle unit 188, the nozzle unit 188 is rotated by the support rotating mechanism 891 to move across the annular opening 81 to the outer side of the chamber 12 while the cup section 161 is kept at the position illustrated in FIG. 8. The nozzle unit 188 is thereby accommodated in the side space 160 between the cup section 161 and the cup facing section 163. Then, the cup section 161 is lowered to the position shown in FIG. 10 by the cup section moving mechanism 162. As the cup section 161 is lowered, the side space 160 decreases its size.

Figure 12:
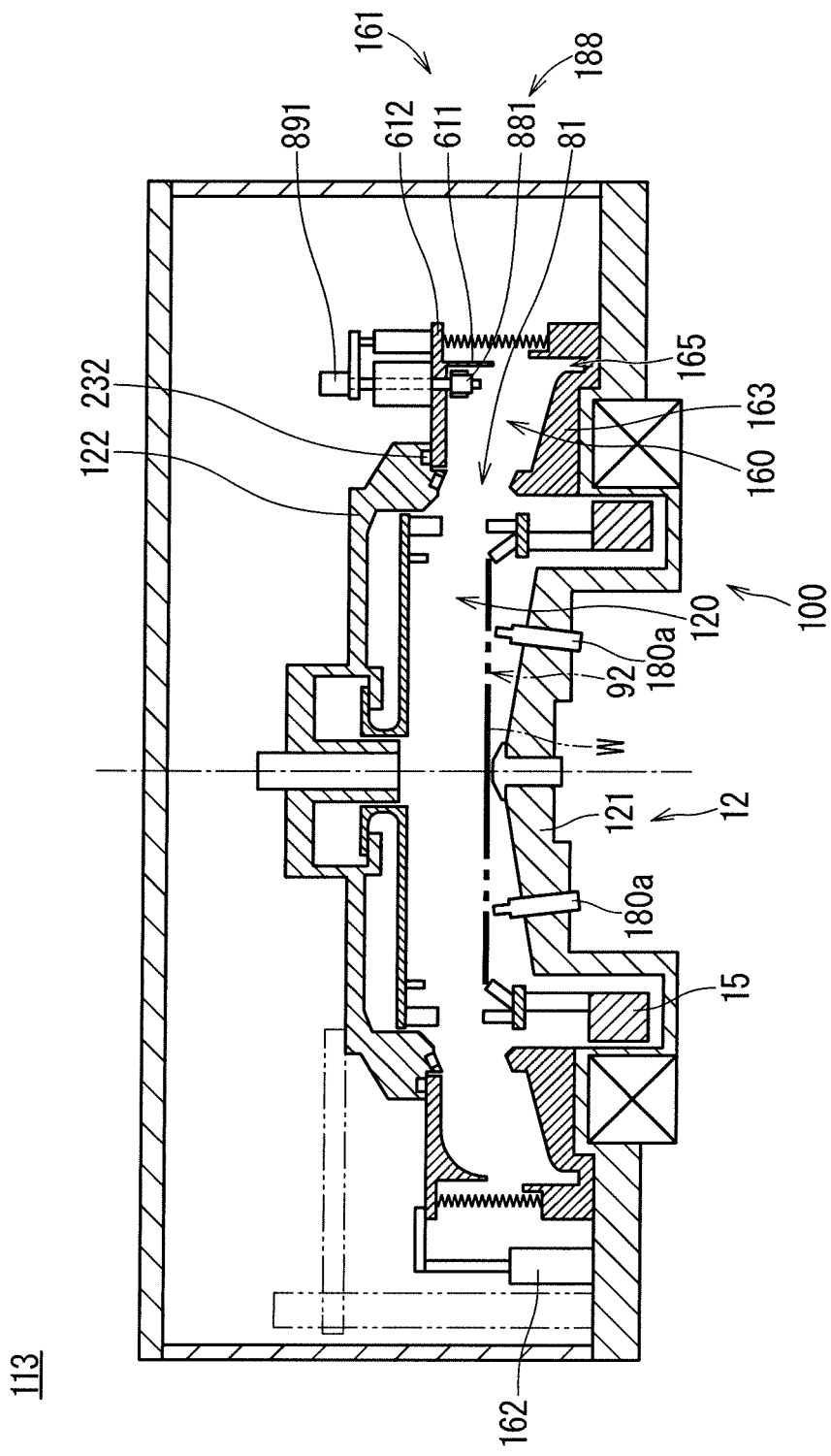
FIG. 12 is a cross-sectional view schematically illustrating a step in the substrate processing method according to the third preferred embodiment.

When the substrate W has been carried in, the cup section 161 is lifted from the position illustrated in FIG. 10 to the position illustrated in FIG. 12 to be positioned on the radially outer side of the annular opening 81 over the entire circumference. In the following description, the state of the chamber 12 and the cup section 161 illustrated in FIG. 12 is referred to as a "first sealed state" (the same applies to the state in FIG. 8). The position of the cup section 161 illustrated in FIG. 12 is referred to as a "liquid receiving position", and the position of the cup section 161 illustrated in FIG. 10 is referred to as a "retracted position". The cup section 161 is moved by the cup section moving mechanism 162 in the up-down direction between the liquid receiving position in which the cup section 161 is on the radially outer side of the annular opening 81 and the retracted position below the liquid receiving position.

When the cup section 161 is in the liquid receiving position, the side wall portion 611 radially faces the annular opening 81. The upper surface of the inner rim of the upper surface portion 612 is in contact with a lip seal 232 at the lower end of the outer rim of the chamber lid 122 over the entire circumference. A sealing portion that prevents passing of gas and/or liquid is formed between the chamber lid 122 and the upper surface portion 612 of the cup section 161. Accordingly, a sealed space surrounded by the chamber body 121, the chamber lid 122, the cup section 161, and the cup facing section 163 (hereinafter, referred to as an "enlarged sealed space 100") is formed. The enlarged sealed space 100 is a single space including the chamber space 120 between the chamber lid 122 and the chamber body 121 and the side space 160 surrounded by the cup section 161 and the cup facing section 163, the chamber space 120 and the side space 160 communicating with each other via the annular opening 81.

Next, step S12 (FIG. 3) of removing the organic film on the substrate W is started. Specifically, the substrate rotating mechanism 15 starts rotating the substrate W at a constant rotation speed (a relatively low rotation speed, hereinafter referred to as a "steady rotation speed"). Then, supply of ozone-containing gas from the ozone supply unit 200 (see FIG. 9) to the enlarged sealed space 100 starts (corresponding to step ST10 (FIG. 5)), and the outer exhaust unit 194 starts discharging the gas in the enlarged sealed space 100. The enlarged sealed space 100 is thereby filled with ozone-containing gas after a lapse of a predetermined time (corresponding to step ST20 (FIG. 5)). Supplying of ozone-containing gas to the enlarged sealed space 100 and discharging of the gas in the enlarged sealed space 100 may be performed from the open state illustrated in FIG. 10.

Next, heated gas is jetted from a plurality of gas jet nozzles 180a toward the lower surface 92 of the rotating substrate W. This heats the substrate W. A predetermined amount of chemical liquid is supplied from the chemical liquid supply unit 300 to the nozzle unit 188 attached to the cup section 161 in the side space 160. As a result, the chemical liquid is pre-dispensed from the atomization nozzle 881 while the nozzle unit 188 is accommodated in the side space 160 (that is, with the entire nozzle unit 188 positioned in the side space 160). The chemical liquid pre-dispensed from the atomization nozzle 881 is received by the liquid receiving recess 165.

When pre-dispensing is finished, the support rotating mechanism 891 disposed outside the enlarged sealed space 100 rotates the nozzle support 882 to move the atomization nozzle 881 across the annular opening 81 to the position above the substrate W as illustrated in FIG. 8. Then, the control unit 10 controls the support rotating mechanism 891 to start reciprocating the atomization nozzle 881 above the substrate W. The atomization nozzle 881 continues reciprocation in a horizontal direction along a predetermined movement path between the central portion and the outer rim of the substrate W.

Then, the chemical liquid is supplied from the chemical liquid supply unit 300 to the atomization nozzle 881, and the atomization nozzle 881 swinging in the horizontal direction starts spraying the chemical liquid to the upper surface 91 of the substrate W (corresponding to step ST40 (FIG. 5)). The rotation of the substrate W spreads the chemical liquid to the outer peripheral portion, and thereby the entire upper surface 91 is covered with the chemical liquid. By continuously spraying the chemical liquid from the atomization nozzle 881 swinging in the horizontal direction to the rotating substrate W (corresponding to step ST50 (FIG. 5)), the chemical liquid can be approximately uniformly supplied to the upper surface 91 of the substrate W. In addition, the uniformity of the temperature of the chemical liquid on the substrate W can be improved. As a result, the uniformity of the chemical liquid processing performed on the substrate W can be improved.

During the spraying of the chemical liquid from the nozzle unit 188, jetting of heated gas from the gas jet nozzles 180a also continues. This heats the substrate W almost at a desired temperature while the upper surface 91 is cleaned with the chemical liquid. As a result, the uniformity of the chemical liquid processing performed on the substrate W can be further improved.

In the enlarged sealed space 100, the chemical liquid scattered from the upper surface 91 of the rotating substrate W flies across the annular opening 81 to be received by the cup section 161, and is then guided to the liquid receiving recess 165. The chemical liquid guided to the liquid receiving recess 165 flows through the first discharge path 191 illustrated in FIG. 9 into the gas-liquid separation unit 193. The chemical liquid collecting unit 195 collects the chemical liquid from the gas-liquid separation unit 193, and impurities and the like are removed from the chemical liquid by a filter or the like. The chemical liquid is then reused.

After a predetermined time (i.e., 60 to 120 seconds) has elapsed since the start of supplying the chemical liquid, supplying of the chemical liquid from the nozzle unit 188 and supplying of the heated gas from the gas jet nozzles 180a are stopped (corresponding to step ST60 (FIG. 5)). The introduction of ozone-containing gas from the ozone supply unit 200 (see FIG. 9) is also stopped (corresponding to step ST30 (FIG. 5)). Subsequently, the substrate rotating mechanism 15 increases the rotation speed of the substrate W to a speed higher than the steady rotation speed for a predetermined time (i.e., 1 to 3 seconds) to remove the chemical liquid from the substrate W. The support rotating mechanism 891 rotates the nozzle unit 188 to move the nozzle unit 188 from the chamber space 120 across the annular opening 81 to the side space 160 as illustrated in FIG. 12.

Figure 13:
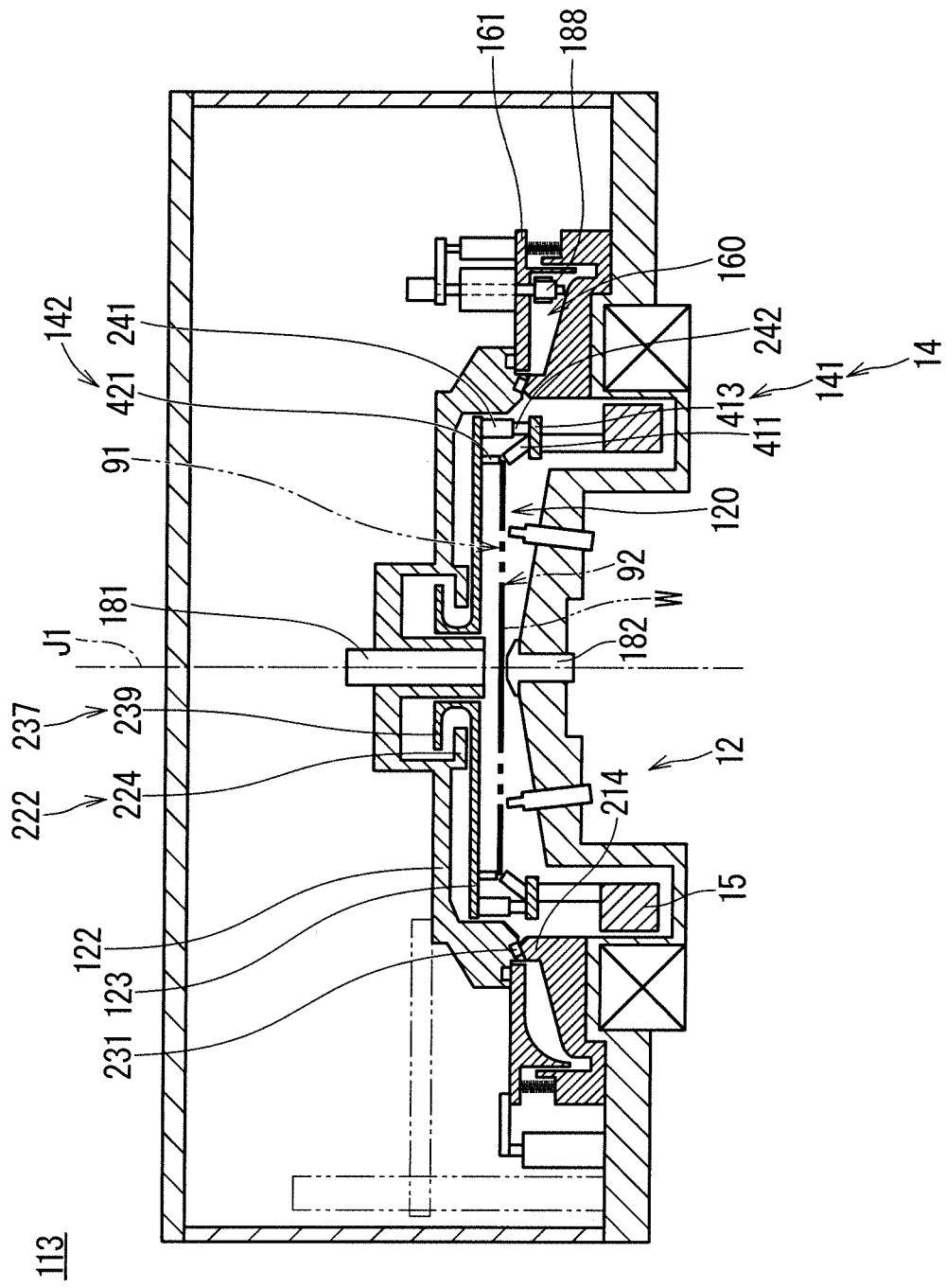
FIG. 13 is a cross-sectional view schematically illustrating a step in the substrate processing method according to the third preferred embodiment.

When the nozzle unit 188 has moved to the side space 160, the chamber lid 122 and the cup section 161 synchronously move downward. Then, as illustrated in FIG. 13, the lip seal 231 at the lower end of the outer rim of the chamber lid 122 comes into contact with the upper portion of the chamber side wall 214, whereby the annular opening 81 is closed, and the chamber space 120 is sealed to be isolated from the side space 160. Similarly to FIG. 10, the cup section 161 is located at the retracted position. The side space 160 is sealed to be isolated from the chamber space 120. Hereinafter, the state of the chamber 12 and the cup section 161 illustrated in FIG. 13 is referred to as a "second sealed state". In the second sealed state, the substrate W directly faces the inner wall of the chamber 12, and there is no other liquid receiving unit therebetween. The nozzle unit 188 is accommodated in the side space 160 to be isolated from the chamber space 120.

In the second sealed state, a plurality of second contact portions 421 of the substrate pressing portion 142 is in contact with the outer rim of the substrate W. Magnets (not illustrated) are provided on the lower surface of the top plate 123 and the support base 413 of the substrate support portion 141. The magnets form pairs each composed of magnets facing each other along the up-down direction. Hereinafter, a pair of magnets is also referred to as a "magnet pair". In the substrate processing apparatus 113, a plurality of magnet pairs are circumferentially arranged at a constant angular interval at positions different from those of the first contact portion 411, the second contact portion 421, the first engagement portion 241, and the second engagement portion 242. In a state where the substrate pressing portion 142 is in contact with the substrate W, a downward force acts on the top plate 123 by magnetic force (attractive force) acting between the magnets of the magnet pairs. The substrate pressing portion 142 thereby presses the substrate W against the substrate support portion 141.

In the substrate processing apparatus 113, the substrate pressing portion 142 presses the substrate W against the substrate support portion 141 with the weight of the top plate 123 and the magnetic force of the magnet pairs, so that the substrate W can be sandwiched and firmly held from above and below by the substrate pressing portion 142 and the substrate support portion 141.

In the second sealed state, the flange portion 239 of the held portion 237 is separated above the flange portion 224 of the plate holding portion 222, and the plate holding portion 222 and the held portion 237 are not in contact with each other. In other words, the holding of the top plate 123 by the plate holding portion 222 is cancelled. Thus, the top plate 123 rotates, independently of the chamber lid 122, by the substrate rotating mechanism 15 together with the substrate holding unit 14 and the substrate W held by the substrate holding unit 14.

In the second sealed state, the second engagement portion 242 is fitted into the recess at the lower portion of the first engagement portion 241. The top plate 123 is thereby in engagement with the support base 413 of the substrate support portion 141, and the relative circumferential movement about the center axis J1 is restricted. In other words, the first engagement portions 241 and the second engagement portions 242 serve as position restricting members that restrict the change in the relative position along the rotational direction (that is, fixes the relative position along the circumferential direction) of the top plate 123 with respect to the substrate support portion 141. When the chamber lid 122 is lowered, the rotational position of the support base 413 is controlled by the substrate rotating mechanism 15 so as the first engagement portions 241 and the second engagement portions 242 are fitted to each other.

When the chamber space 120 and the side space 160 are individually sealed, discharging of the gas by the outer exhaust unit 194 (see FIG. 9) is stopped, and at the same time discharging of the gas in the chamber space 120 by the inner exhaust unit 198 starts. The supply of pure water as a rinsing liquid to the substrate W is started by the pure water supply unit 184 (step S13 (FIG. 3)).

The pure water from the pure water supply unit 184 is discharged from the upper nozzle 181 and the lower nozzle 182, and is continuously supplied to the central portions of the upper surface 91 and the lower surface 92 of the substrate W. The pure water spreads to the outer peripheral portions of the upper surface 91 and the lower surface 92 by the rotation of the substrate W, and is scattered outward from the outer peripheral edge of the substrate W. The pure water scattered from the substrate W is received by the inner wall of the chamber 12 (that is, the inner walls of the chamber lid 122 and the chamber side wall 214), and is drained through the second discharge path 192, the gas-liquid separation unit 197, and the liquid drain unit 199 illustrated in FIG. 9 (the same applies to a drying processing of the substrate W described later). This works as a rinsing process of the upper surface 91 of the substrate W and a cleaning process of the lower surface 92 of the substrate W, and at the same time the inside of the chamber 12 is substantially cleaned.

After a predetermined time has elapsed since the start of supplying pure water, supplying of pure water from the pure water supply unit 184 is stopped. Then, in the chamber space 120, the rotation speed of the substrate W is increased to a speed sufficiently higher than the steady rotation speed. This removes pure water on the substrate W, and the drying process of the substrate W is performed (step S14 (FIG. 3)).

After a predetermined time has elapsed since the start of the drying process, the rotation of the substrate W is stopped. The chamber space 120 may be depressurized by the inner exhaust unit 198 to perform the drying process of the substrate W in a depressurized atmosphere of which pressure is lower than the atmospheric pressure. After supplying the pure water by the pure water supply unit 184 and before drying the substrate W, IPA may be supplied from the IPA supply unit 185 onto the substrate W to replace the pure water on the substrate W with IPA.

Then, the chamber lid 122 and the top plate 123 are lifted, and thereby the chamber 12 is in the open state as illustrated in FIG. 10. In step S14, since the top plate 123 rotates together with the substrate support portion 141, little liquid remains on the lower surface of the top plate 123, so that there is no liquid dropping from the top plate 123 onto the substrate W when the chamber lid 122 is lifted. The substrate W is carried out of the chamber 12 by an external carrying mechanism (step S15 (FIG. 3)).

The chamber open-and-close mechanism 131 does not necessarily need to move the chamber lid 122 in the up-down direction. For example, the chamber open-and-close mechanism 131 may move the chamber body 121 in the up-down direction with the chamber lid 122 fixed. The chamber 12 does not necessarily need to have a substantially cylindrical shape, but may have one among various shapes. The shapes and structures of the stator 151 and the rotor 152 of the substrate rotating mechanism 15 may be modified in various forms. The rotor 152 does not necessarily need to be rotated in a floating state. A structure such as a guide for mechanically supporting the rotor 152 may be provided in the chamber 12 to rotate the rotor 152 along the guide. The substrate rotating mechanism 15 does not necessarily need to be a hollow motor. An axially rotating motor may be used as the substrate rotating mechanism. In the substrate processing apparatus 113, the enlarged sealed space 100 may be formed by a portion other than the upper surface portion 612 of the (outer) cup section 161 (for example, the side wall portion 611) coming into contact with the chamber lid 122. The shapes of the (outer) cup section 161 and an inner cup section 161a may be appropriately changed.

According to the third preferred embodiment, high sealability can be secured for the chamber 12 in which processing using ozone is performed. Note that, in the above description, a case in which a process flow similar to that in FIG. 5 (first preferred embodiment) is performed in the third preferred embodiment is described in detail, but instead, a process flow similar to that in FIG. 7 (the second preferred embodiment) may be performed. In this case, at least either of the pressure gauge 250 (FIG. 6: second preferred embodiment) and the ozone concentration gauge may be provided to measure the atmosphere in the chamber 12 (FIG. 8).

The configurations and steps described in the above preferred embodiments and exemplary modifications can be appropriately combined or omitted as long as they do not cause any contradiction.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method for removing an organic film on a substrate, the substrate processing method comprising:
   a) carrying out introduction of ozone-containing gas into a substrate processing chamber to fill at least a space above said substrate in said substrate processing chamber with ozone-containing gas;
   b) starting spraying through said space a heated chemical liquid containing sulfuric acid onto said substrate after said step a);
   c) continuing said spraying started in said step b); and
   d) stopping said spraying continued in said step c), wherein
   said chemical liquid is sprayed from an atomization nozzle that faces an upper surface of said substrate in said step b), so said ozone is reacted with said sulfuric acid.

2. The substrate processing method according to claim 1, wherein
   said a) includes confirming that a measured value of at least either of pressure and ozone concentration in said substrate processing chamber is equal to or more than a predetermined threshold.

3. The substrate processing method according to claim 1, wherein
   after said introduction of ozone-containing gas into said substrate processing chamber in said a), said introduction is continued in said step b) and said step c).

4. The substrate processing method according to claim 1, wherein
   after said introduction of ozone-containing gas into said substrate processing chamber in said a), said introduction is stopped before said step c).

5. The substrate processing method according to claim 1, wherein
   said chemical liquid sprayed in said step c) is separated into a first liquid collected by being received by a cup section surrounding said substrate and a second liquid collected outside said cup section, and said second liquid not containing said first liquid is sprayed again.

6. A substrate processing apparatus for removing an organic film on a substrate, the substrate processing apparatus comprising:
   a substrate processing chamber;
   a substrate holder configured to hold said substrate in said substrate processing chamber;
   an ozone supplier configured to supply ozone-containing gas into said substrate processing chamber;
   an atomization nozzle configured to spray a chemical liquid containing sulfuric acid onto said substrate;
   a chemical liquid supplier including a heater and configured to supply said chemical liquid heated by said heater to said atomization nozzle; and
   a controller configured to control said ozone supplier to fill at least a space above said substrate in said substrate processing chamber with ozone-containing gas, and then control said chemical liquid supplier to start spraying said chemical liquid through said space onto said substrate so that said substrate is processed by said chemical liquid that has been reacted with said ozone in said space, wherein
   said atomization nozzle is arranged to face an upper surface of said substrate.

7. The substrate processing method according to claim 1, wherein
said substrate is processed by said chemical liquid that has been reacted with said ozone in said space by said step b) and said step c).

8. The substrate processing apparatus according to claim 6, wherein
said ozone supplier includes a pipe connected to said substrate processing chamber, said pipe being arranged higher than said upper surface of said substrate.

9. A substrate processing method for removing an organic film on a substrate, the substrate processing method comprising:
  a) carrying out introduction of ozone-containing gas into a substrate processing chamber to fill at least a space above said substrate in said substrate processing chamber with ozone-containing gas;
  b) starting spraying through said space a heated chemical liquid containing sulfuric acid onto said substrate after said a);
  c) continuing said spraying started in said step b); and
  d) stopping said spraying continued in said step c), wherein
  said substrate is processed by said chemical liquid that has been reacted with said ozone in said space by said step b) and said step c).

* * * * *